(12) United States Patent
Wu et al.

(10) Patent No.: US 12,074,168 B2
(45) Date of Patent: Aug. 27, 2024

(54) SEMICONDUCTOR DEVICE AND METHOD OF MANUFACTURING THE SAME

(71) Applicant: TAIWAN SEMICONDUCTOR MANUFACTURING COMPANY, Hsinchu (TW)

(72) Inventors: Guo-Huei Wu, Tainan (TW); Jerry Chang Jui Kao, Taipei (TW); Chih-Liang Chen, Hsinchu (TW); Hui-Zhong Zhuang, Kaohsiung (TW); Jung-Chan Yang, Taoyuan County (TW); Lee-Chung Lu, Taipei (TW); Xiangdong Chen, San Diego, CA (US)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/136,216

(22) Filed: Apr. 18, 2023

(65) Prior Publication Data
US 2023/0253406 A1  Aug. 10, 2023

Related U.S. Application Data

(63) Continuation of application No. 17/373,548, filed on Jul. 12, 2021, now Pat. No. 11,664,380, which is a continuation of application No. 16/797,890, filed on Feb. 21, 2020, now Pat. No. 11,063,045.

(60) Provisional application No. 62/834,117, filed on Apr. 15, 2019.

(51) Int. Cl.
*H01L 27/092* (2006.01)
*H01L 21/8238* (2006.01)
*H01L 23/528* (2006.01)

(52) U.S. Cl.
CPC .. *H01L 27/0924* (2013.01); *H01L 21/823821* (2013.01); *H01L 21/823871* (2013.01); *H01L 23/5286* (2013.01)

(58) Field of Classification Search
None
See application file for complete search history.

(56) References Cited

U.S. PATENT DOCUMENTS

| 11,282,861 | B2* | 3/2022 | Nelson | H01L 21/845 |
| 2017/0012117 | A1* | 1/2017 | Radosavljevic | H01L 29/66969 |
| 2018/0145030 | A1 | 5/2018 | Beyne et al. | |

(Continued)

FOREIGN PATENT DOCUMENTS

| TW | 201735182 A | 10/2017 |
| WO | 2017/191799 A1 | 11/2017 |

OTHER PUBLICATIONS

Non-Final Office Action issued in related U.S. Appl. No. 16/797,890, dated Dec. 7, 2020.

(Continued)

*Primary Examiner* — Hsien Ming Lee
(74) *Attorney, Agent, or Firm* — STUDEBAKER & BRACKETT PC

(57) ABSTRACT

A semiconductor device having a standard cell, includes a first power supply line, a second power supply line, a first gate-all-around field effect transistor (GAA FET) disposed over a substrate, and a second GAA FET disposed above the first GAA FET. The first power supply line and the second power supply line are located at vertically different levels from each other.

20 Claims, 33 Drawing Sheets

(56) References Cited

U.S. PATENT DOCUMENTS

2019/0074297 A1  3/2019  Kishishita et al.
2019/0319021 A1  10/2019  Xu et al.
2021/0210468 A1  7/2021  Takeno et al.

OTHER PUBLICATIONS

Notice of Allowance issued in related U.S. Appl. No. 16/797,890, dated Mar. 10, 2021.
Notice of Allowance issued in related U.S. Appl. No. 17/373,548, dated Jan. 18, 2023.
Non-Final Office Action issued in related U.S. Appl. No. 17/373,548, dated Sep. 26, 2022.

* cited by examiner

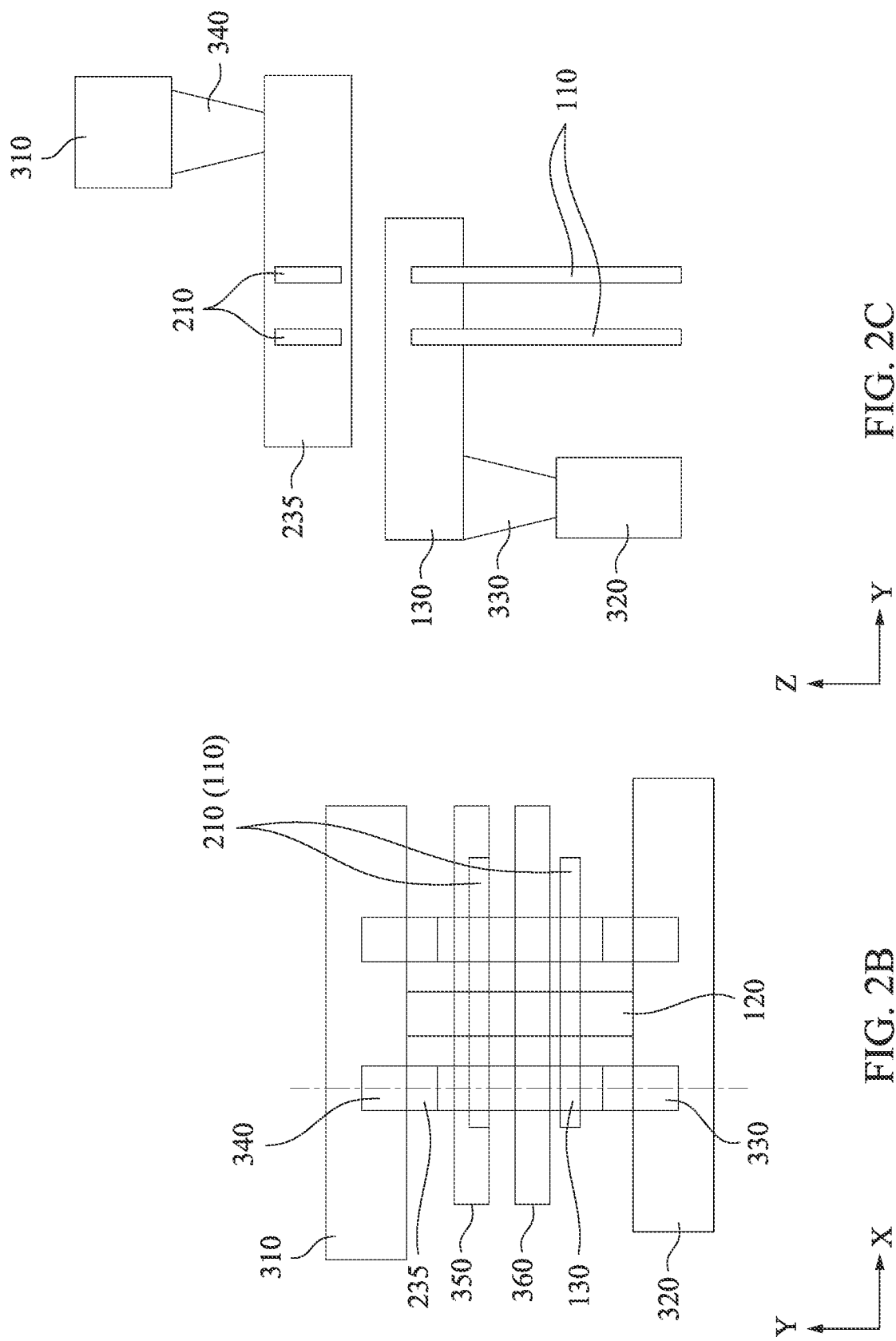

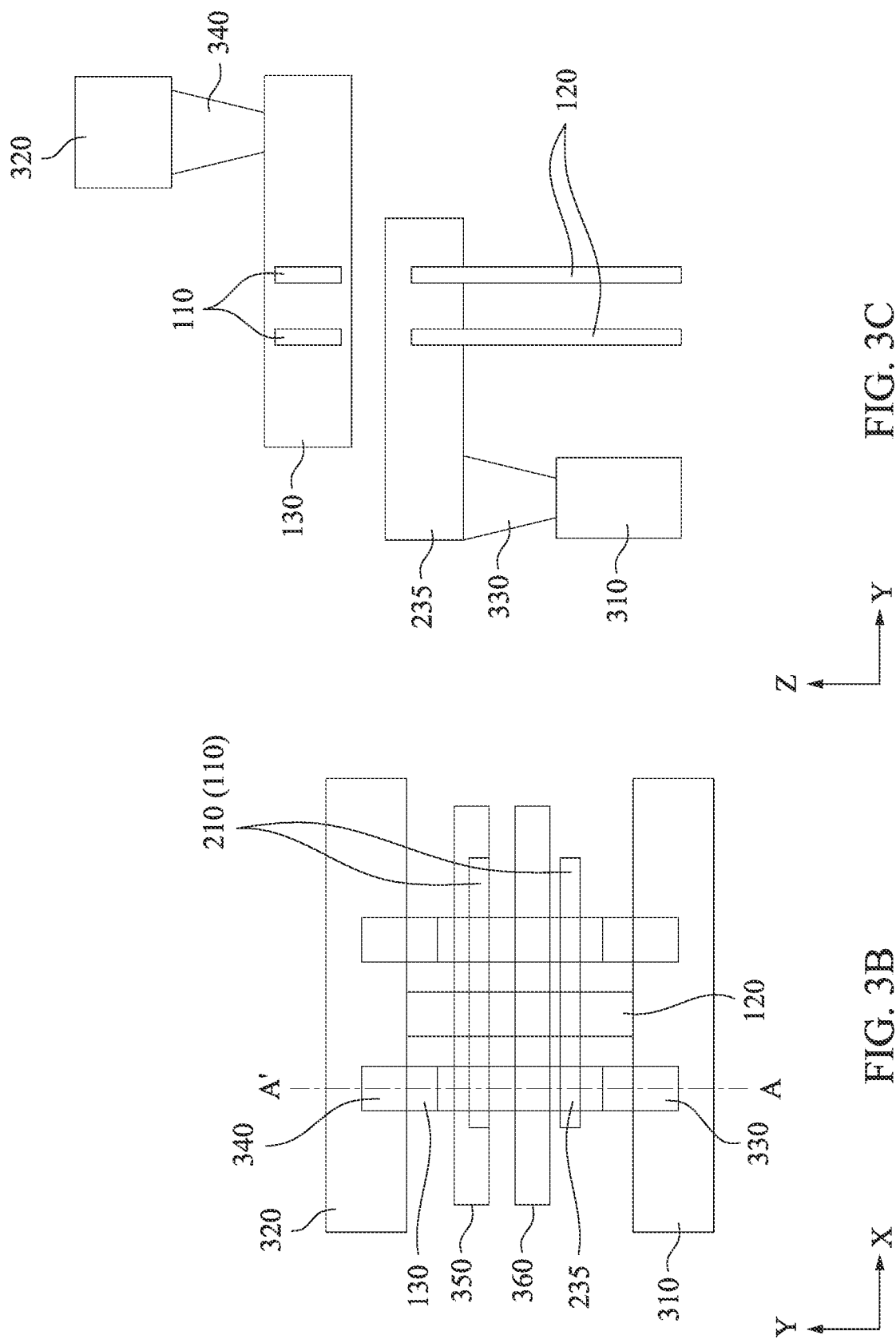

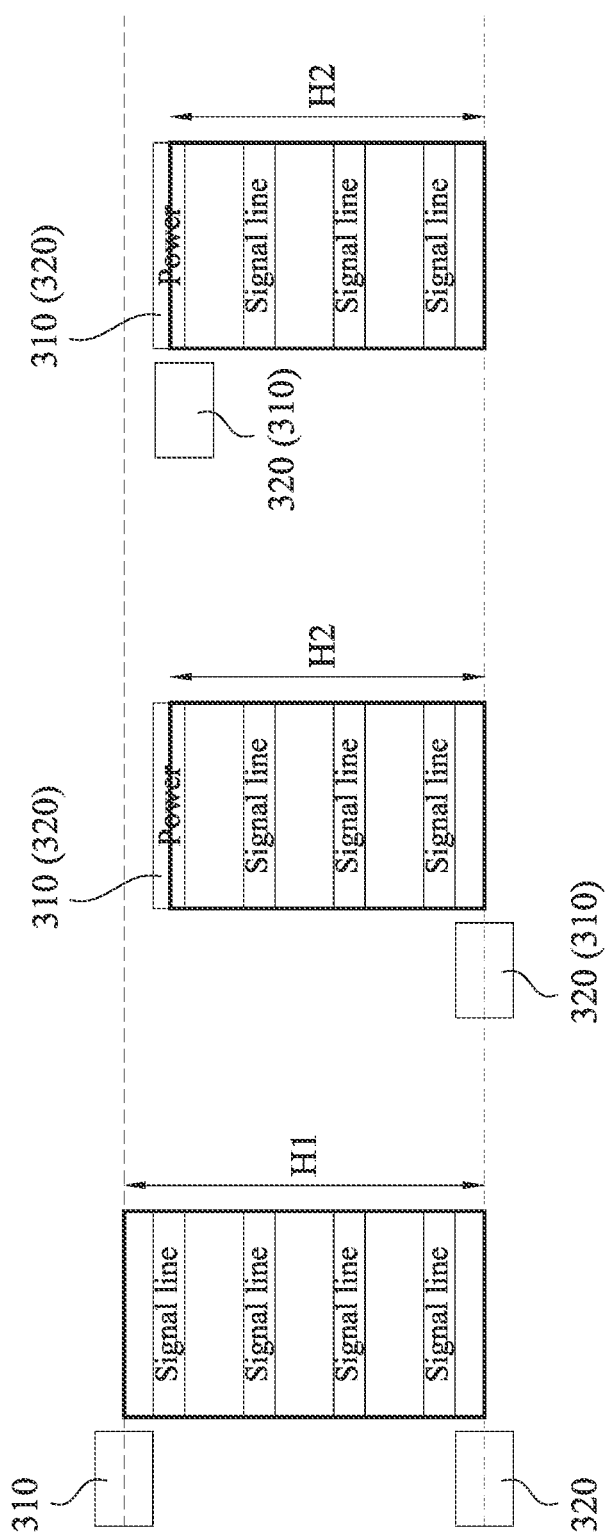

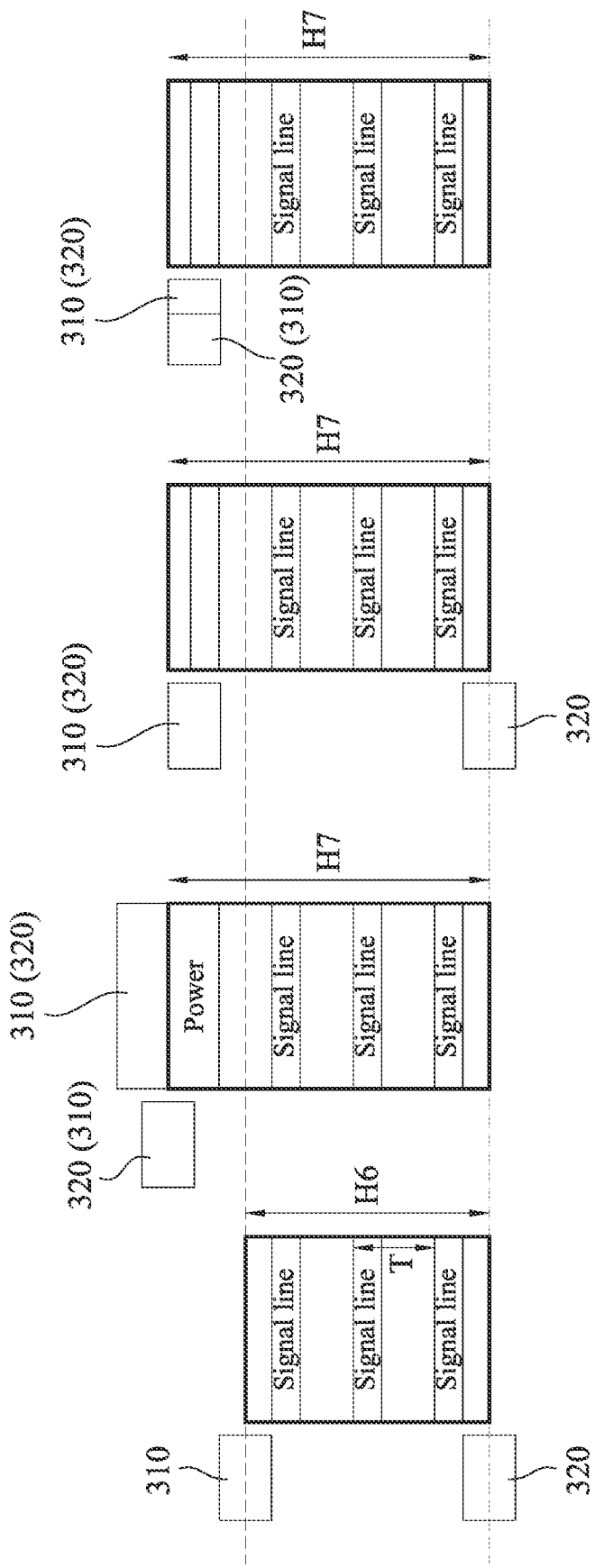

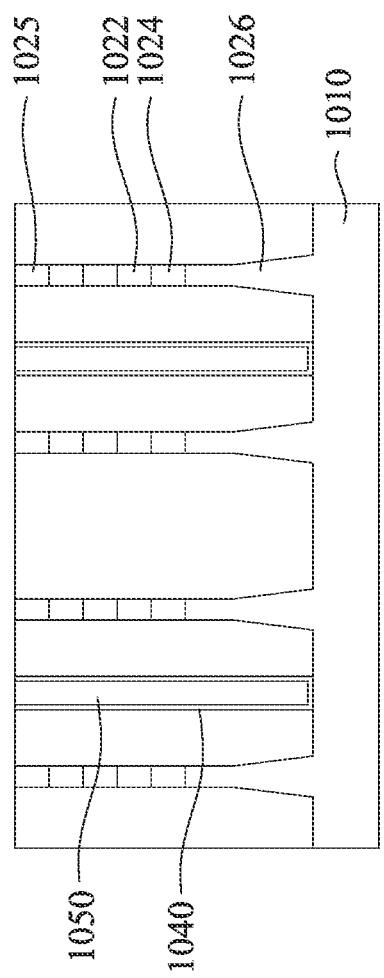
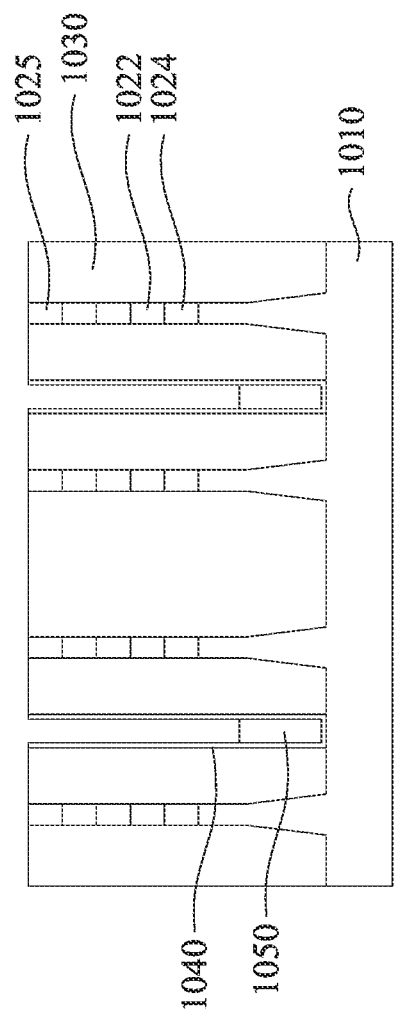
FIG. 16A
FIG. 16B

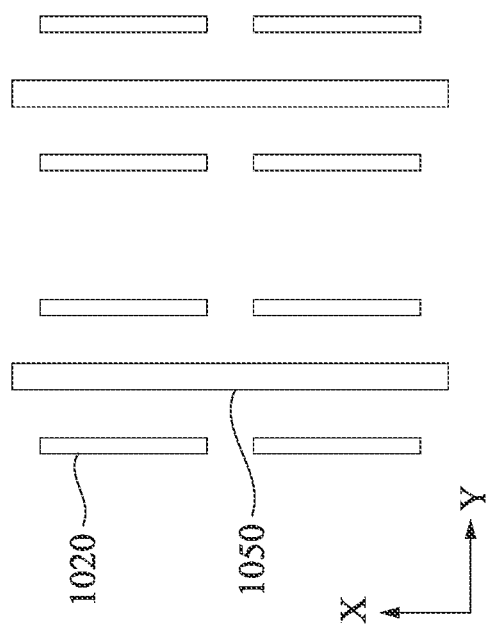
FIG. 17C
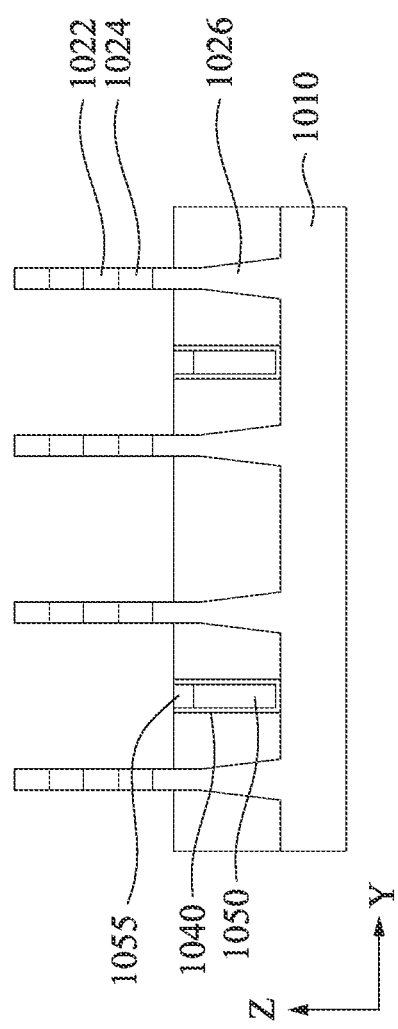
FIG. 17A
FIG. 17B

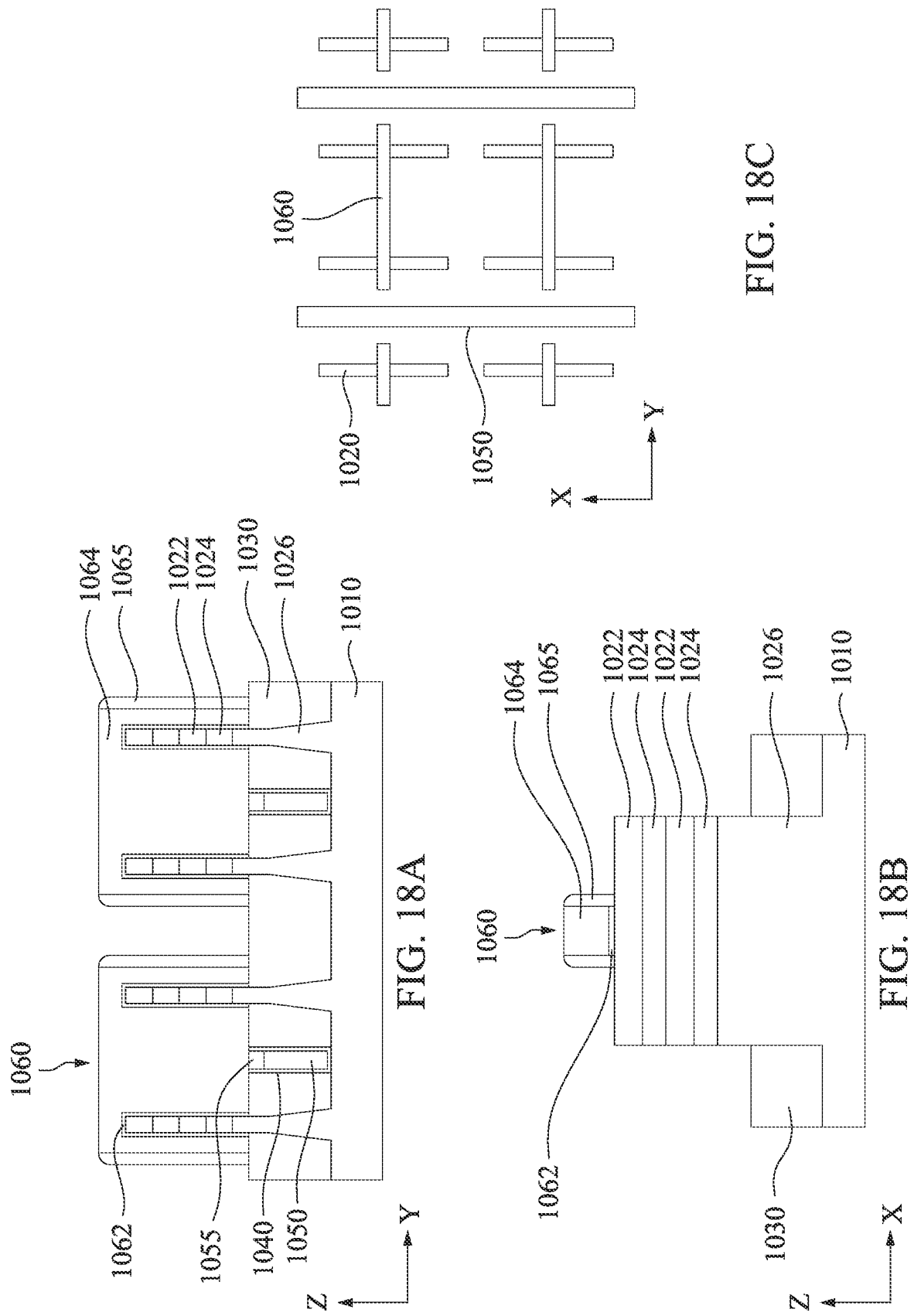

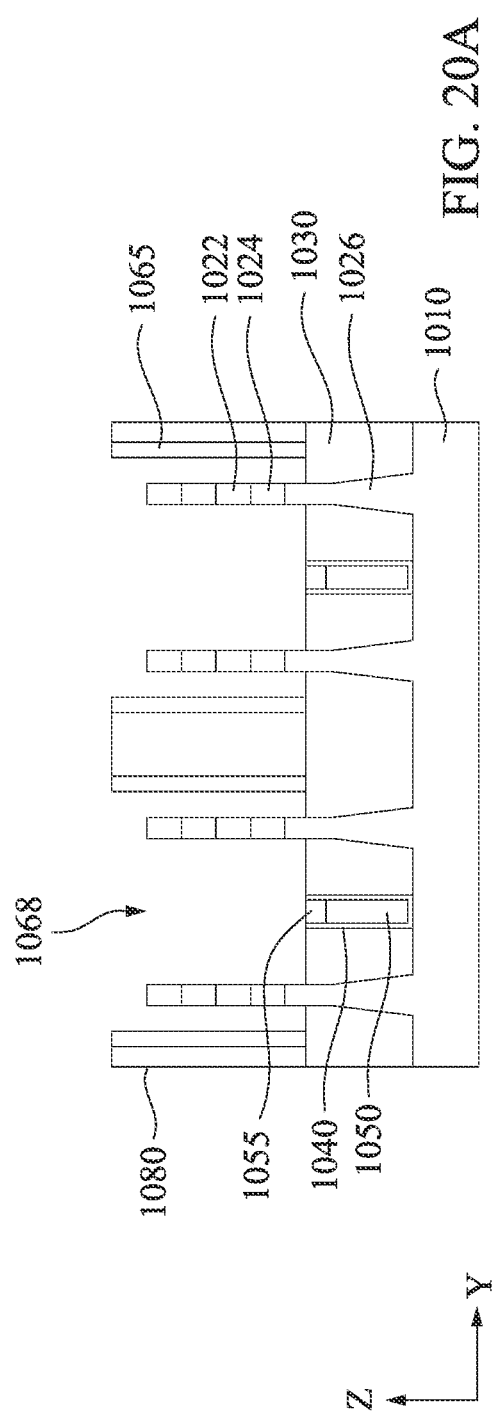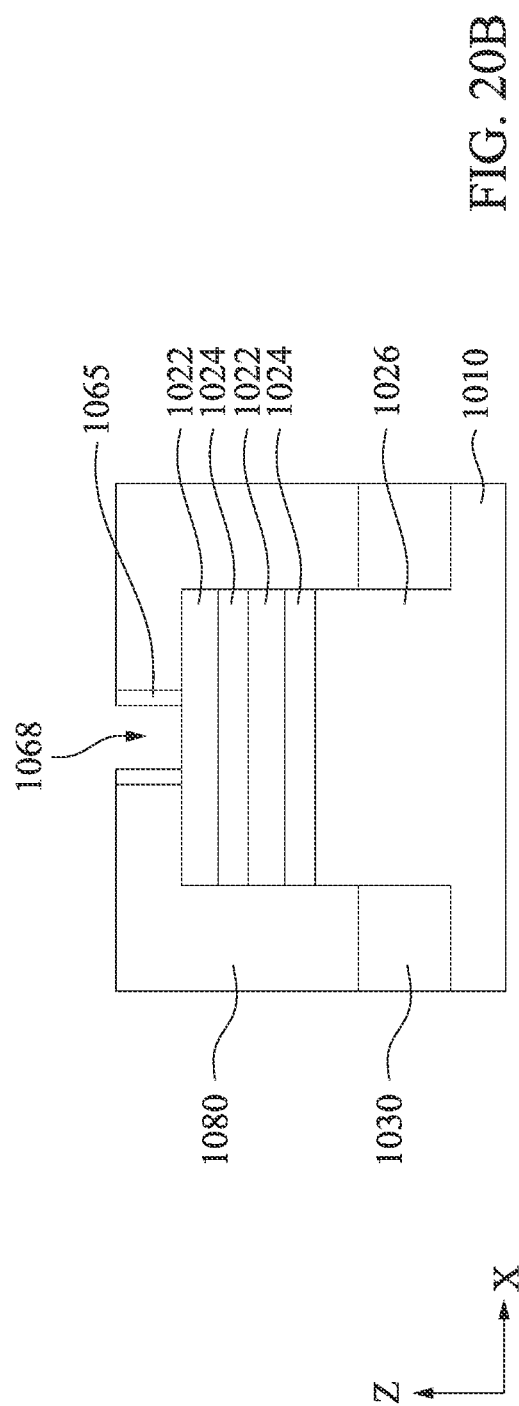

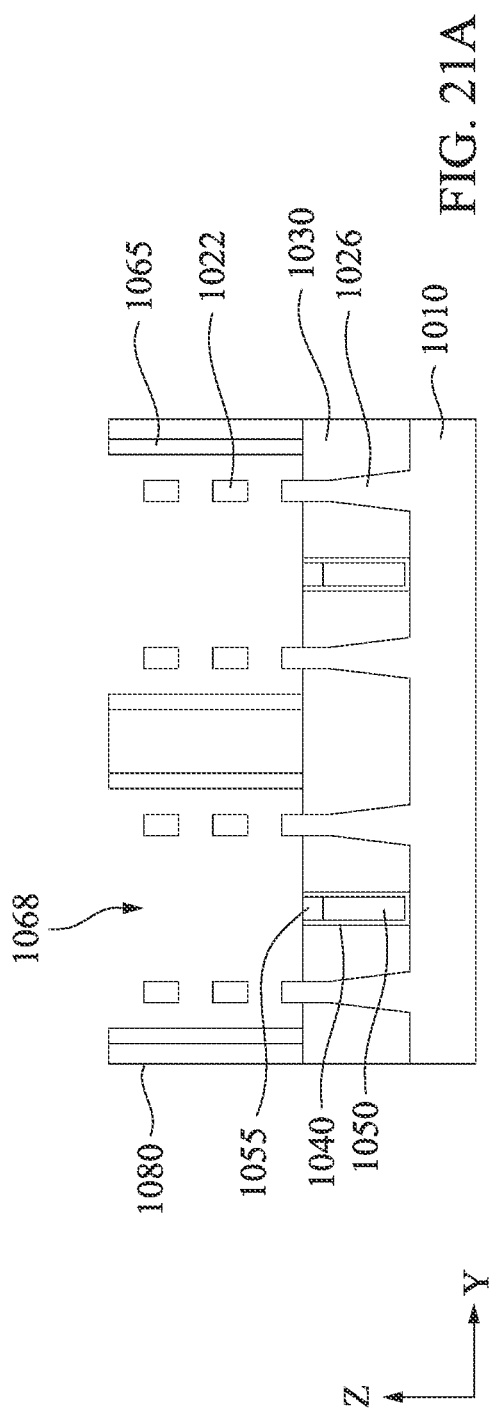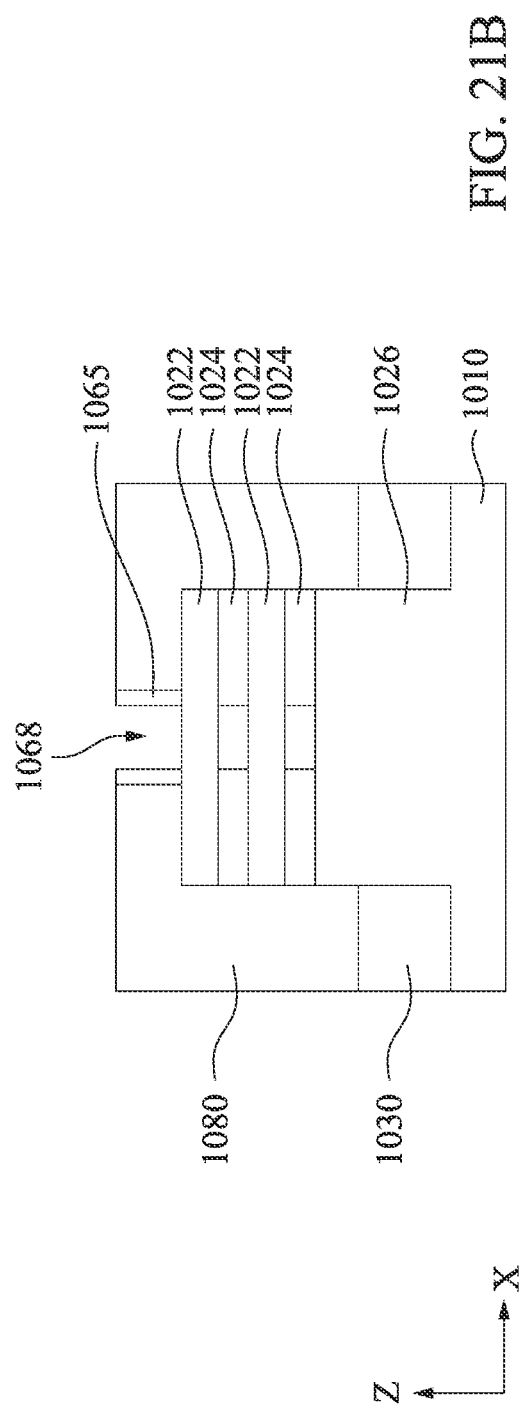
FIG. 21A
FIG. 21B

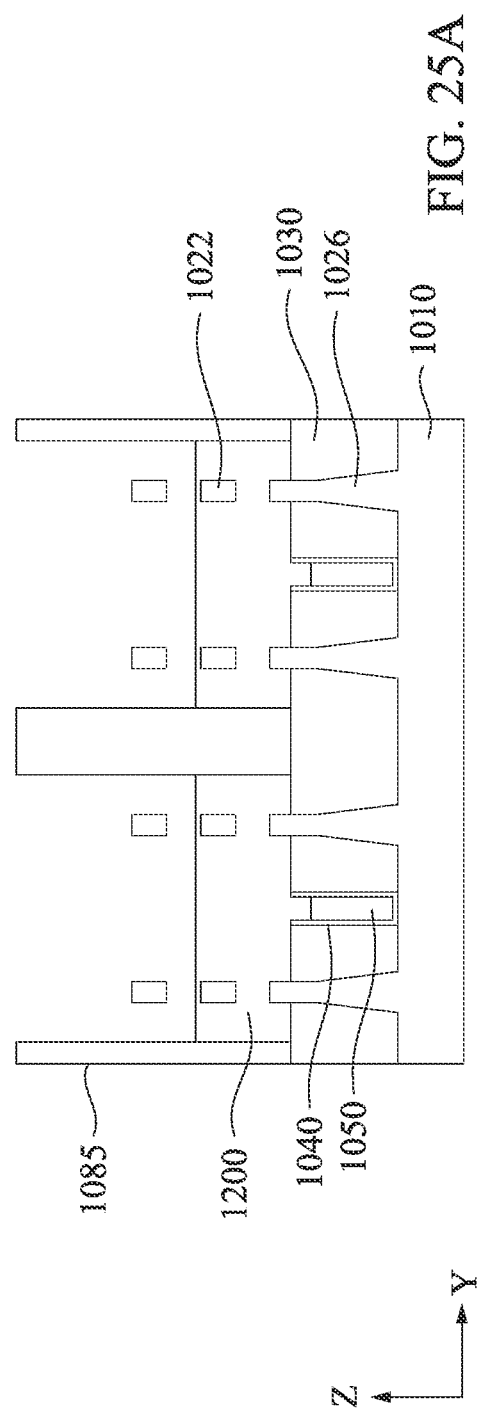
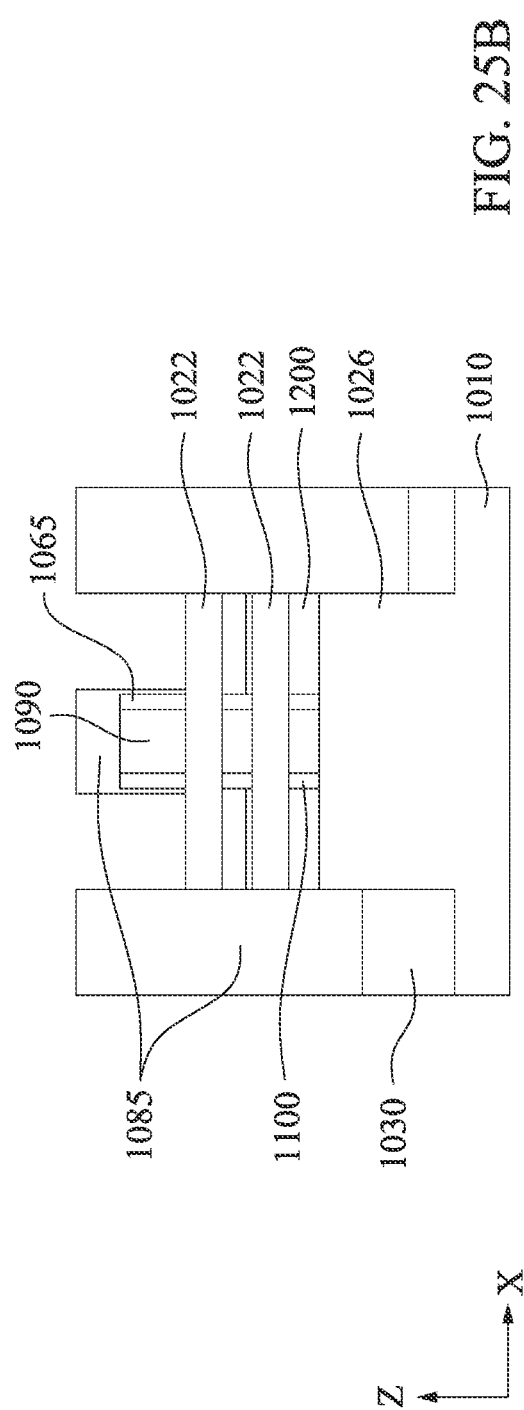

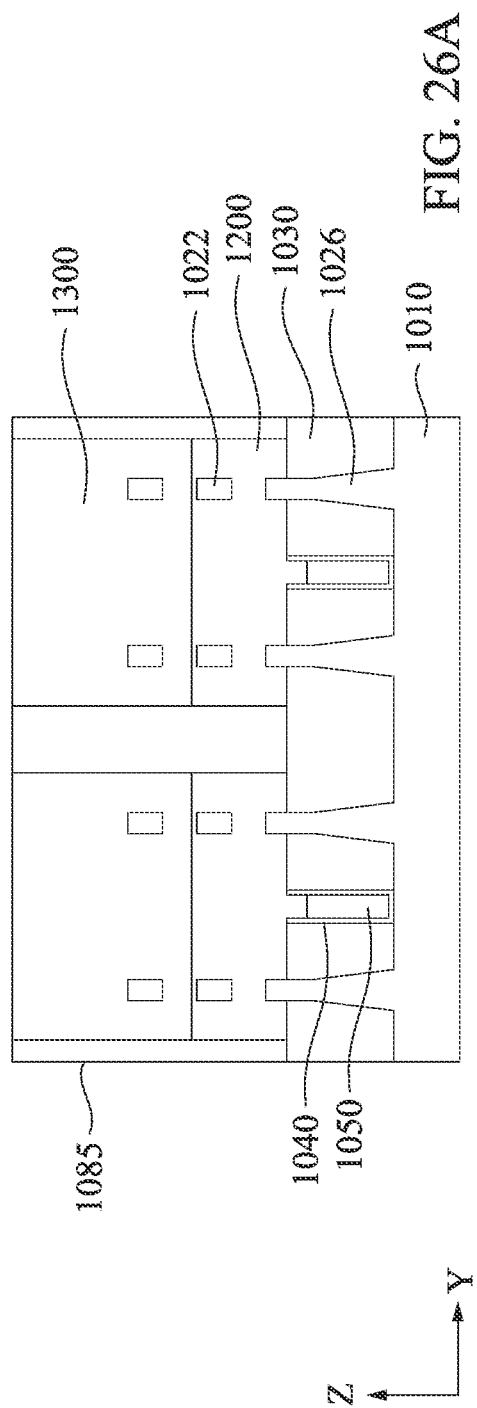
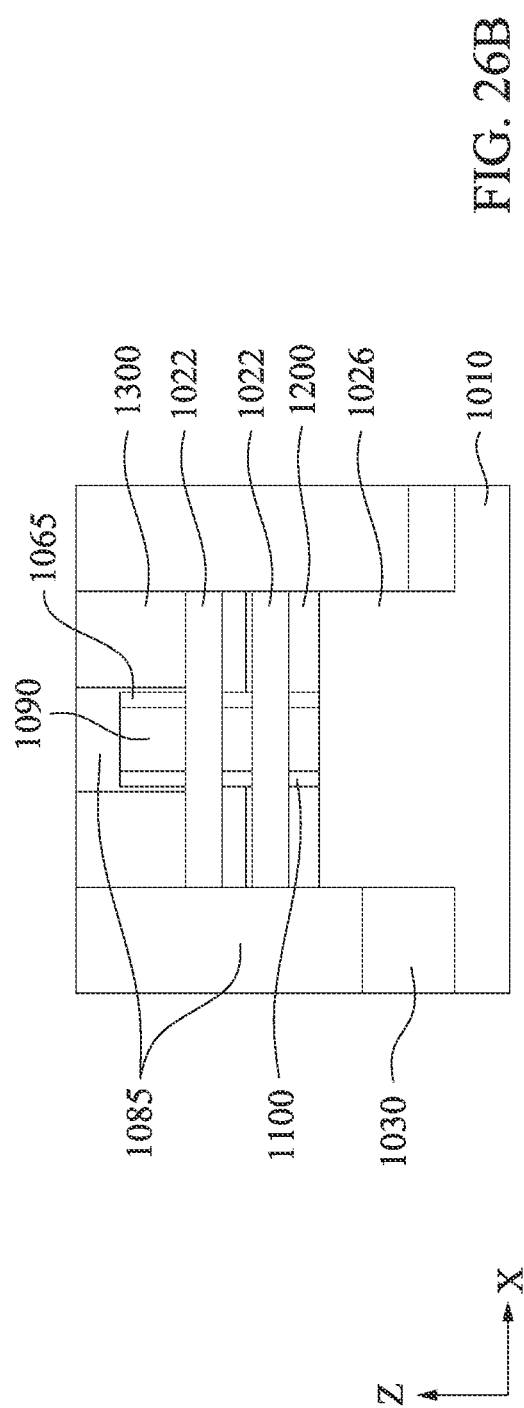

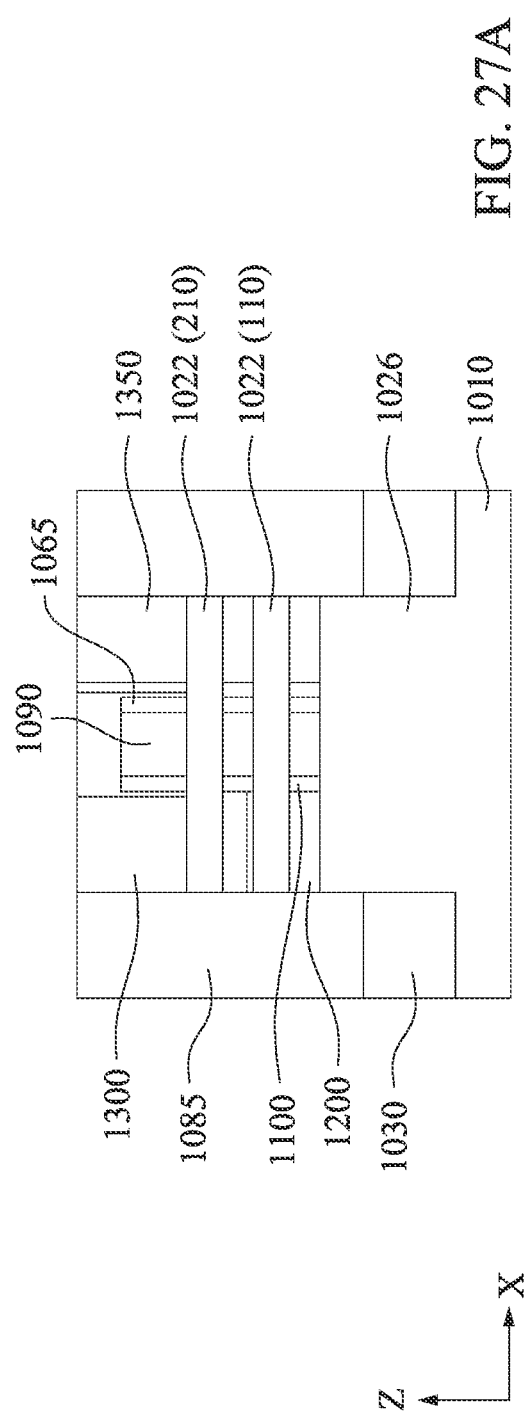
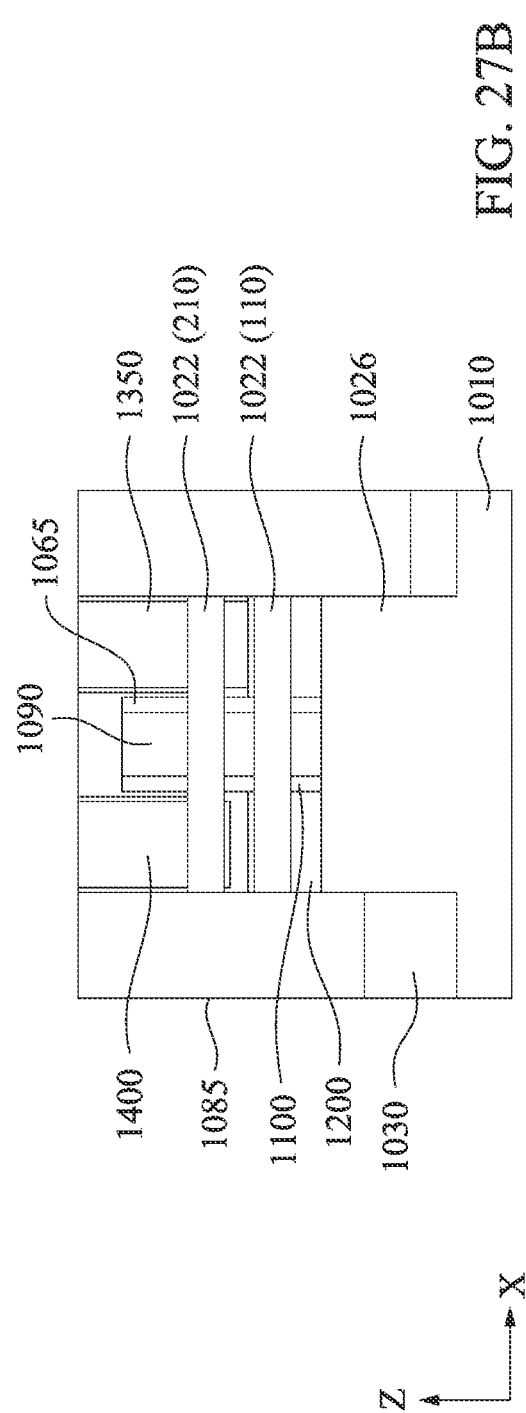

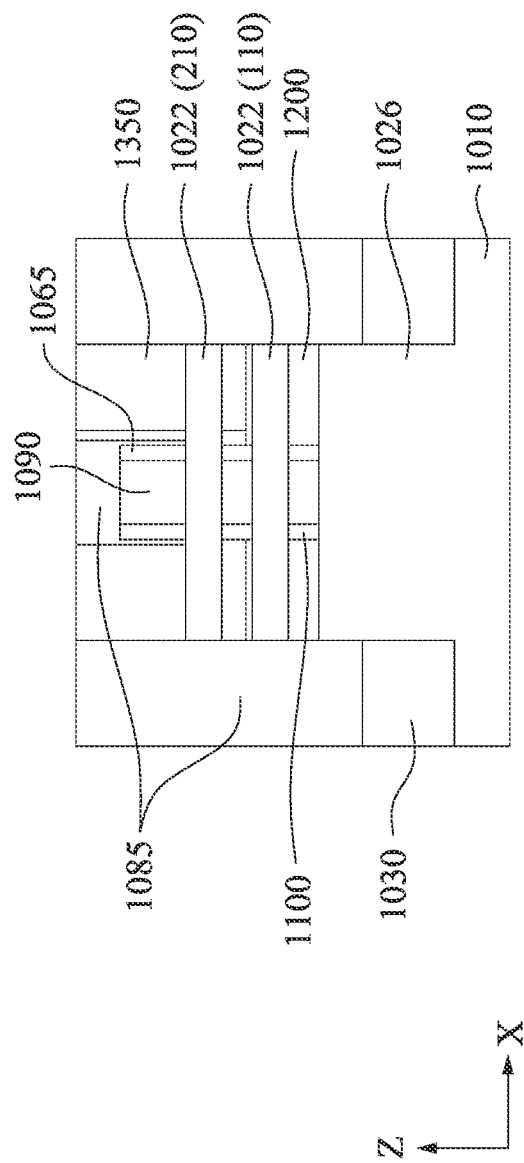
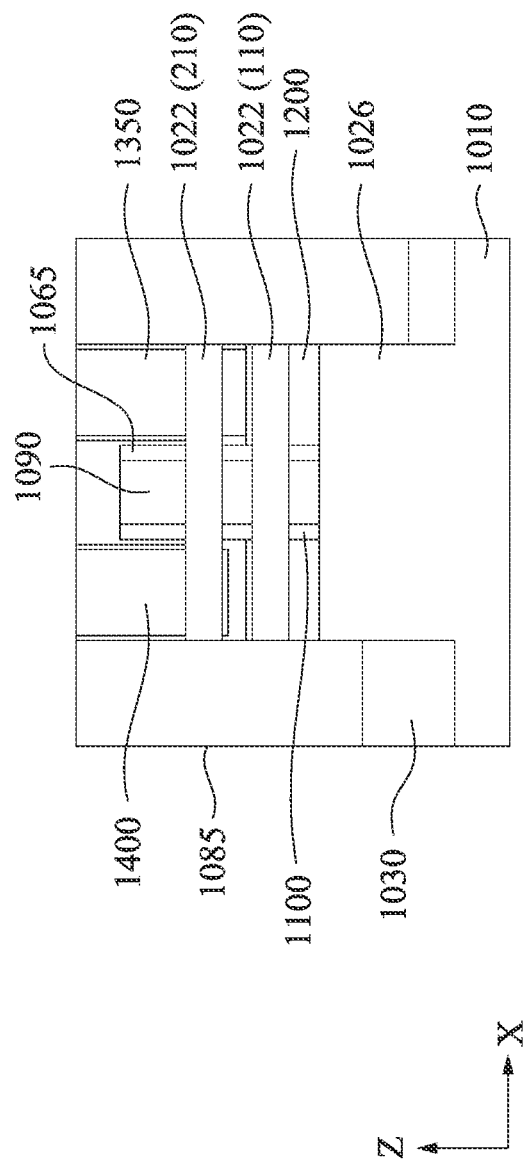

SEMICONDUCTOR DEVICE AND METHOD OF MANUFACTURING THE SAME

RELATED APPLICATIONS

This application is a continuation of U.S. patent application Ser. No. 17/373,548 filed Jul. 12, 2021, which is a continuation of U.S. patent application Ser. No. 16/797,890 filed Feb. 21, 2020, now U.S. Pat. No. 11,063,045, which claims priority to U.S. Provisional Patent Application No. 62/834,117 filed Apr. 15, 2019, the entire contents of each of which are incorporated herein by reference.

BACKGROUND

The disclosure relates to method of manufacturing semiconductor integrated circuits, and more particularly to method of manufacturing semiconductor devices including fin field effect transistors (FinFETs) and/or gate-all-around FETs vertically stacked, and semiconductor devices. As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a FinFET and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B and 2C show a schematic view of a vertically arranged complementary FET (CFET) according to an embodiment of the present disclosure.

FIGS. 3A, 3B and 3C show a schematic view of a vertically arranged complementary FET (CFET) according to an embodiment of the present disclosure.

FIGS. 10A, 10B and 10C show MO wiring layouts according to an embodiment of the present disclosure.

FIGS. 14A, 14B, 14C and 14D show MO wiring layouts according to an embodiment of the present disclosure.

FIGS. 16A, 16B and 16C show various views illustrating manufacturing operations of a CFET according to an embodiment of the present disclosure.

FIGS. 17A, 17B and 17C show various views illustrating manufacturing operations of a CFET according to an embodiment of the present disclosure.

FIGS. 18A, 18B and 18C show various views illustrating manufacturing operations of a CFET according to an embodiment of the present disclosure.

FIGS. 20A and 20B show various views illustrating manufacturing operations of a CFET according to an embodiment of the present disclosure.

FIGS. 21A and 21B show various views illustrating manufacturing operations of a CFET according to an embodiment of the present disclosure.

FIGS. 25A, 25B, 25C and 25D show various views illustrating manufacturing operations of a CFET according to an embodiment of the present disclosure.

FIGS. 26A and 26B show various views illustrating manufacturing operations of a CFET according to an embodiment of the present disclosure.

FIGS. 27A and 27B show various views illustrating manufacturing operations of a CFET according to an embodiment of the present disclosure.

FIGS. 28A and 28B show various views illustrating manufacturing operations of a CFET according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of."

As the size of semiconductor devices become smaller, a cell height of standard cells also become smaller. The cell height is generally defined as a distance (pitch) between two power supply lines, VDD and VSS, and is generally determined by the number and a pitch of fin structures and/or metal lines. The VDD supplied a higher potential than the VSS. The cell height is also called a track height. Typical track heights are 7.5 T, 6.5 T or 5.5 T, where T is a smallest pitch of metal lines running over the standard cell. Scaling down to 4.5 T or 4 T is currently required to further minimize the size of semiconductor devices. To reduce the cell height, a complementary FET (CFET) in which a p-type FET and an n-type FET are vertically stacked has been proposed.

Figure 1:
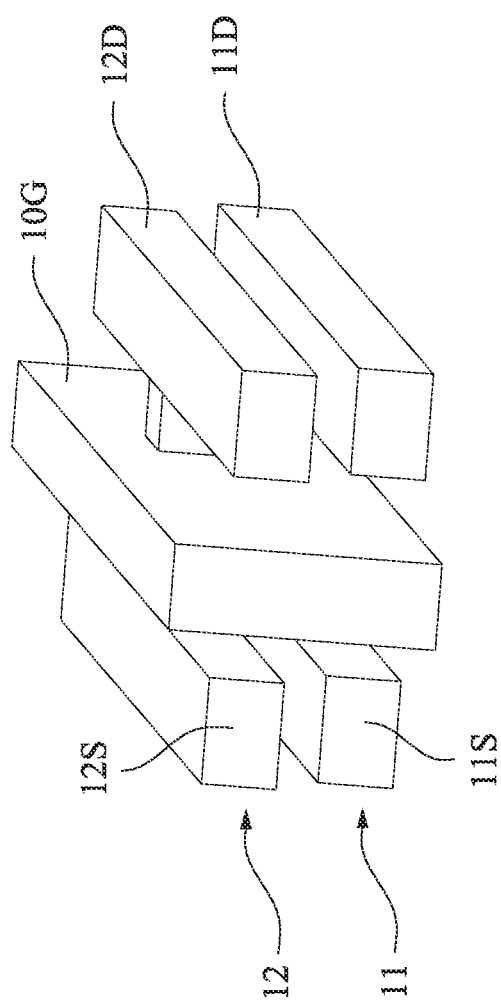
FIG. 1 shows a conceptual view of a vertically arranged complementary FET (CFET).

As shown in FIG. 1, in a CFET, a first gate-all-around field effect transistor (GAA FET) 11 is disposed over a substrate, and a second GAA FET 12 is disposed above the first GAA FET 11. The first GAA FET 11 includes a first source 11S and a first drain 11D, and the second GAA FET 12 includes a second source 12S and the second drain 12D. The source/drain of the first GAA FET is electrically separated from the source/drain of the second GAA FET in some embodiments. A gate structure 10G including a gate dielectric layer and a gate electrode layer is commonly formed around the channel region of the first and second GAA FETs. In some embodiments, the first GAA FET 11 is a first conductivity type (e.g., n-type) FET and the second GAA FET 12 is a second conductivity type (e.g., p-type) different from the first conductivity type. In other embodiments, the first and second GAA FETs have the same conductivity type.

The source of the second (upper) GAA FET 12 is coupled to a first power supply line, e.g., Vdd, and the source of the first (bottom) GAA FET 11 is coupled to a second power supply line, e.g., Vss. It is noted that power supply lines are shared by adjacent cells (along the Y direction shown in FIGS. 10A-14D).

FIGS. 2A-14D show various power supply line (power rail) arrangements for a CFET according to embodiments of the present disclosure.

Figure 2A:
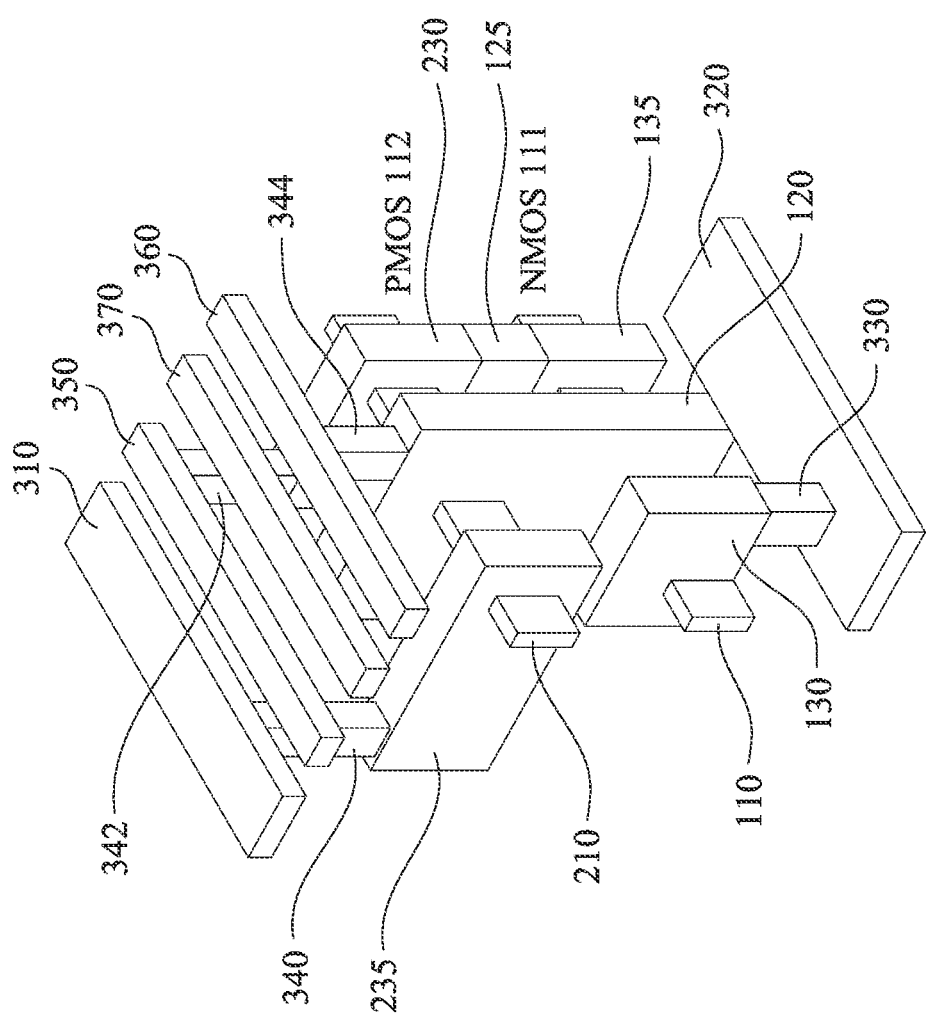

FIGS. 2A, 2B and 2C show a schematic view of a vertically arranged complementary FET (CFET) according to an embodiment of the present disclosure. FIG. 2A is a perspective view, FIG. 2B is a plan view and FIG. 2C is a cross sectional view of the CFET according to an embodiment of the present disclosure. FIGS. 2A-2C show a CMOS invertor circuit using a CFET. In the following structures, it is possible to avoid a deep contact (e.g., a contact connecting a source or a drain to a buried power supply line located below the CFET). Thus, parasitic via resistance can be reduced, and formation of a deep via having a high aspect ratio, which is generally difficult, can be avoided.

In some embodiments, one of the power supply lines (power rail) Vdd 310 (e.g., positive potential) and Vss 320 (e.g., negative or ground potential) for supplying power to the CFET is located below the CFET and the other of the power supply lines is located above the CFET.

In FIGS. 2A-2C, the CFET includes an NMOS 111 and a PMOS 112 disposed above the NMOS 111. The NMOS 111 includes a fin or a wire 110 having a channel region and source/drain regions, a gate structure 120 wrapping around the channel region of the fin 110, a source contact 130 wrapping around the source region of the fin 110 and a drain contact 135 wrapping around the drain region of the fin 110. The PMOS 112 includes a fin or a wire 210 having a channel region and source/drain regions, the gate 120 wrapping around the channel region of the fin 210, a source contact 230 wrapping around the source region of the fin 210 and a drain contact 235 wrapping around the drain region of the fin 210. The gate 120 is shared by the NMOS 111 and PMOS 112.

In some embodiments, the fins 110, 210 are made of a crystalline semiconductor material, such as Si, SiGe, Ge, SiGeSn, GaAs, InSb, GaP, GaSb, InAlAs, InGaAs, GaSbP, GaAsSb or InP. In certain embodiments, Si is used.

The gate 120 incudes a gate dielectric layer, one or more work function adjustment layers and a body gate electrode layer in some embodiments. In some embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer includes an interfacial layer formed between the channel layers and the dielectric material. The gate dielectric layer may be formed by CVD, ALD or any suitable method. In one embodiment, the gate dielectric layer is formed using a highly conformal deposition process such as ALD in order to ensure the formation of a gate dielectric layer having a uniform thickness around each channel layers. The thickness of the gate dielectric layer is in a range from about 1 nm to about 6 nm in one embodiment.

The gate electrode layer is formed on the gate dielectric layer to surround each channel layer. The gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer may be formed by CVD, ALD, electro-plating, or other suitable method.

In certain embodiments of the present disclosure, one or more work function adjustment layers are disposed on the gate dielectric layer. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. The work function adjustment layer may be formed by ALD, PVD, CVD, e-beam evaporation, or other suitable process.

The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIGS. 2A-2C, the source contact 130 of the NMOS 111 is coupled to the power supply line VSS through a bottom via contact 330, while the drain contact 235 of the PMOS 112 is coupled to the power supply line Vdd 310 through a top via contact 340. The power supply line Vss 320 is located below the NMOS 111 and the power supply line Vdd 310 is located above the PMOS 112 in some embodiments. The vertical length (height) of the bottom via contact 330 is substantially the same as the vertical length (height) of the top via contact 340 in some embodiments. The vertical length (height) of the bottom via contact 330 is about 0.5 times to 2 times of the height of the top via contact 340 in some embodiments. In other embodiments, the vertical length (height) of the bottom via contact 330 is about 0.8 times to 1.2 times of the height of the top via contact 340. When the size difference is beyond than these ranges, one of the via contacts would be a deep contact, and thus parasitic via resistance would increase, and formation of a deep via having a high aspect ratio, which is generally difficult, would be necessary.

In some embodiments, signal lines 350, 360 and 370 are disposed over the CFET as shown in FIG. 2A. In some embodiments, the signal line 350 is coupled to the source contact 230 of the PMOS 112 through a via contact 342, and the signal line 360 is coupled to the gate (gate electrode) 120 of the CFET through a via contact 344. The signal line 360 is an input of the invertor and the signal line 340 is an output of the invertor in some embodiments.

In some embodiments, the power supply line 310 and the signal lines 350, 360 and 370 are formed in the same metal wiring level (MO), and the top via contact 340 and the via contacts 342, 344 are formed in the same via level.

In some embodiments, the bottom via contact 330, the source contact 130 and the drain contact 135 of the NMOS 111, the source contact 230 and the drain contact 235 of the PMOS 112, the bar contact 125, the top via contact 340 and/or the via contact 342, 344 are made of the same conductive material, or different conductive materials. The conductive material is one or more layers of Co, Ni, W, Ti, Ta, Cu, Al, TiN and TaN, or any other suitable material. In some embodiments, a silicide layer is formed over source/drain regions of the fin before forming the conductive material. The silicide layer includes one or more of WSi, CoSi, NiSi, TiSi, MoSi and TaSi. In some embodiments, the power supply line 310 and the signal lines 350, 360 and 370 are made of one or more layers of Co, Ni, W, Ti, Ta, Cu, Al, TiN and TaN, or any other suitable material.

In some embodiments, two fins 110 and two fins 210 are horizontally arranged, respectively, and wrapped around by the gate 120, as shown in FIGS. 2B and 2C. The number of the fins per gate can be three or more and up to 10 in some embodiments.

In some embodiments, a channel of the NMOS 111 made of the same material as a channel of the PMOS 112, for example, Si. In other embodiments, the channel of the NMOS 111 made of a different material than the channel of the PMOS 112. In some embodiments, the channel of the NMOS 111 is made of Si and the channel of the PMOS 112 is made of SiGe.

In FIGS. 2A-2C, because one of the power supply lines (e.g., Vss 320) is formed as a buried power supply line, it is possible to reduce the cell height.

Figure 3A:
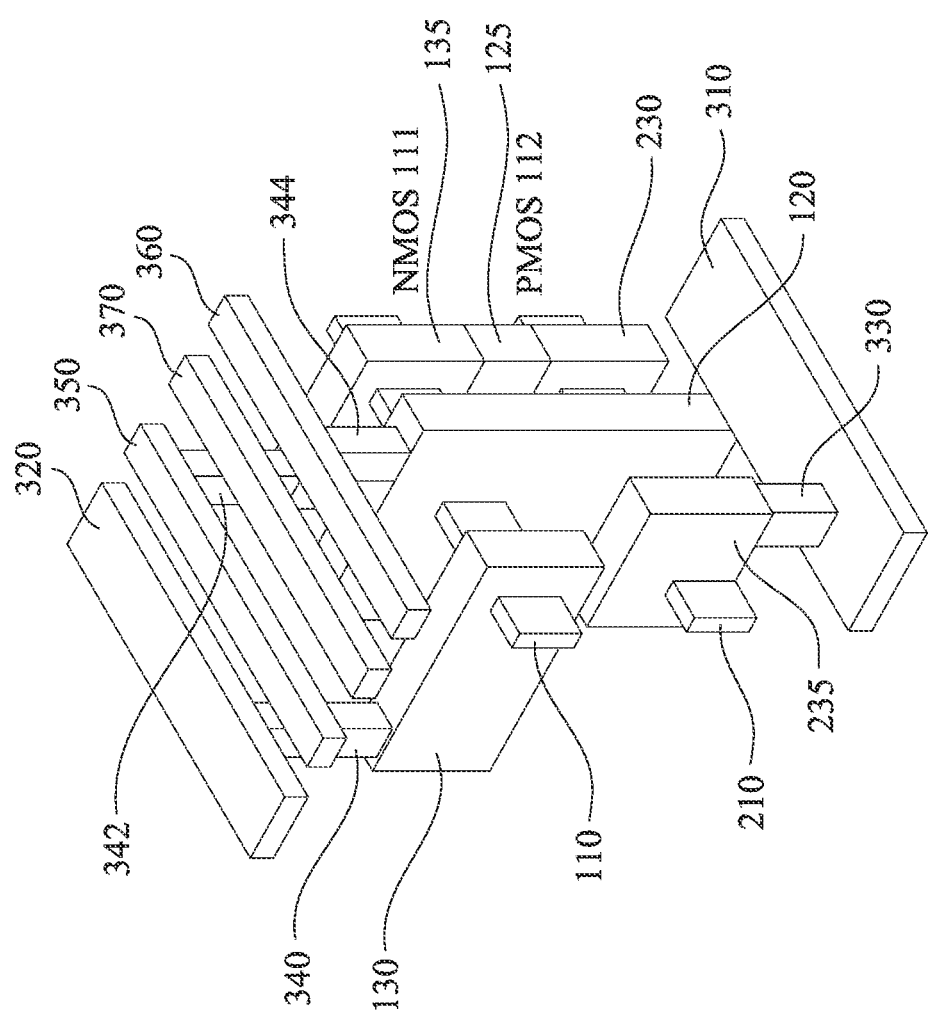

FIGS. 3A, 3B and 3C show a schematic view of a CFET according to another embodiment of the present disclosure. FIG. 3A is a perspective view, FIG. 3B is a plan view and FIG. 3C is a cross sectional view of the CFET according to an embodiment of the present disclosure. Material, configuration, dimensions and/or processes the same as or similar to the foregoing embodiments described with respect to FIGS. 2A-2C may be employed in the following embodiments, and detailed explanation thereof may be omitted.

In FIGS. 3A-3C, the CFET includes a NMOS 111 and a PMOS 112 disposed below the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIGS. 3A-3C, the source contact 130 of the NMOS 111 is coupled to the power supply line Vss 320 through a top via contact 340, while the drain contact 235 of the PMOS 112 is coupled to the power supply line Vdd 310 through a bottom via contact 330. The power supply line Vss 320 is located above the NMOS 111 and the power supply line Vdd 310 is located below the PMOS 112. The vertical length (height) of the bottom via contact 330 is about 0.5 times to 2 times of the height of the top via contact 340 in some embodiments. When the size difference is beyond than these ranges, one of the via contacts would be a deep contact, and thus parasitic via resistance would increase, and formation of a deep via having a high aspect ratio, which is generally difficult, would be necessary. In other embodiments, the vertical length (height) of the bottom via contact 330 is about 0.8 times to 1.2 times of the height of the top via contact 340. In FIGS. 3A-3C, because one of the power supply lines (e.g., Vdd 310) is formed as a buried power supply line, it is possible to reduce the cell height.

Figure 4:
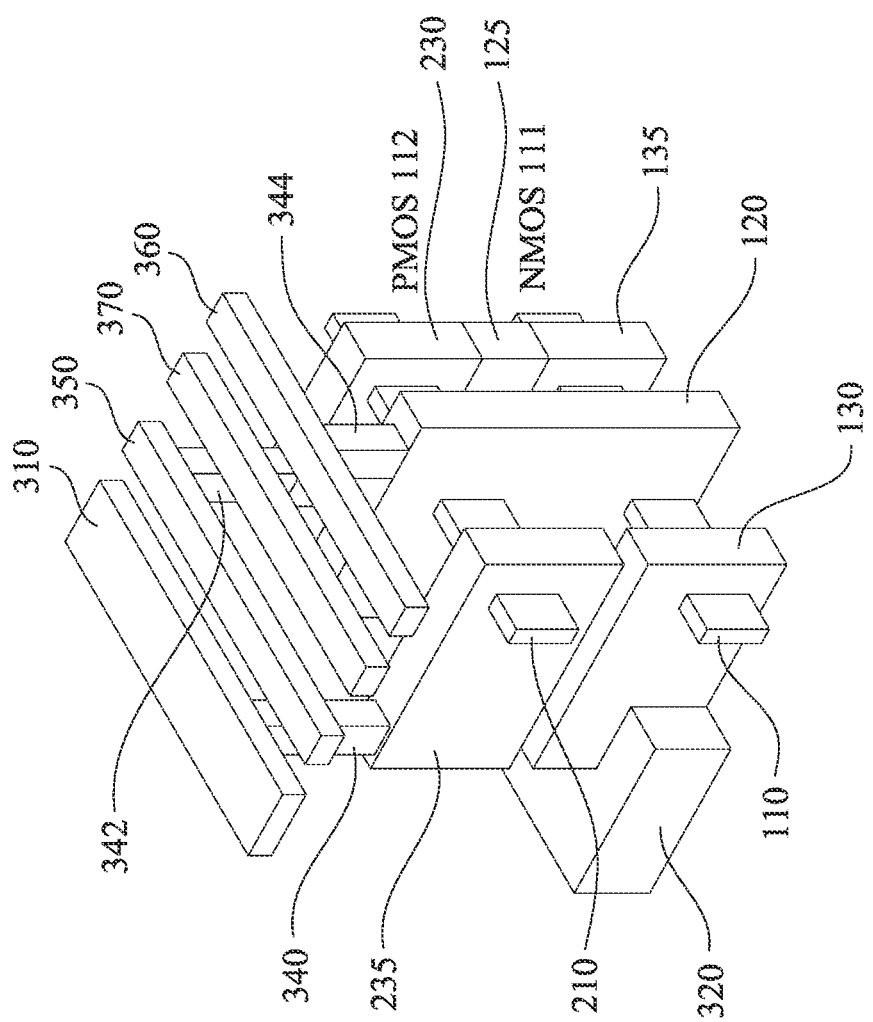
FIG. 4 shows a schematic view of a vertically arranged complementary FET (CFET) according to an embodiment of the present disclosure.

FIG. 4 shows a perspective view of a CFET according to another embodiment of the present disclosure. Material, configuration, dimensions and/or processes the same as or similar to the foregoing embodiments described with respect to FIGS. 2A-3C may be employed in the following embodiments, and detailed explanation thereof may be omitted.

In FIG. 4, the CFET includes a NMOS 111 and a PMOS 112 disposed above the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIG. 4, the source contact 130 of the NMOS 111 is coupled to the power supply line Vss 320 disposed in the same wiring layer as the source contact 130, while the drain contact 235 of the PMOS 112 is coupled to the power supply line Vdd 310 through a top via contact 340. The power supply line Vss 320 is located at the same level as the NMOS 111 (source/drain contact layer) and is directly connected to the source (source region of the fin 110) of the NMOS 111, and the power supply line Vdd 310 is located above the PMOS 112. With this structure, it is possible to remove a via formation process (e.g., 330). In FIG. 4, because one of the power supply lines (e.g., Vss 320) is formed at the same level as the NMOS 111, it is possible to reduce the cell height.

In some embodiments, the power supply line Vss 320 is made of the same material as the source/drain contact 130 of the NMOS 111. In other embodiments, the power supply line Vss 320 is made of a different material than the source/drain contact 130 of the NMOS 111. In some embodiments, the power supply line Vss 320 is one or more layers of Co, Ni, W, Ti, Ta, Cu, Al, TiN and TaN, or any other suitable material.

Figure 5:
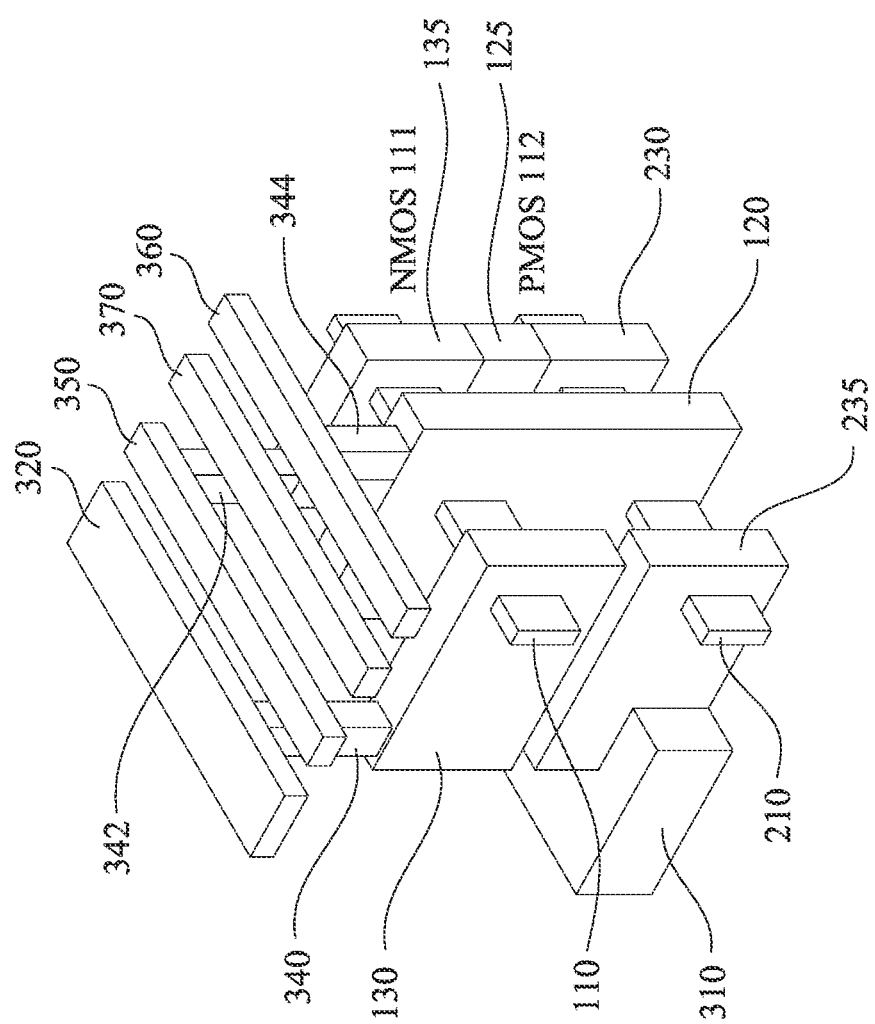
FIG. 5 shows a schematic view of a vertically arranged complementary FET (CFET) according to an embodiment of the present disclosure.

FIG. 5 shows a perspective view of a CFET according to another embodiment of the present disclosure. Material, configuration, dimensions and/or processes the same as or similar to the foregoing embodiments described with respect to FIGS. 2A-4 may be employed in the following embodiments, and detailed explanation thereof may be omitted.

In FIG. 5, the CFET includes a NMOS 111 and a PMOS 112 disposed below the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIG. 5, the source contact 130 of the NMOS 111 is coupled to the power supply line Vss 320 through a top via contact 340, while the drain contact 235 of the PMOS 112 is coupled to the power supply line Vdd 310 disposed in the same wiring layer as the drain contact 235. The power supply line Vss 320 is located above the NMOS 111 and the power supply line Vdd 310 is located at the same level as the PMOS 112 (source/drain contact layer) and is directly connected to the drain (drain region of the fin 210) of the PMOS 112. With this structure, it is possible to remove a via formation process (e.g., 330). In FIG. 5, because one of the power supply lines (e.g., Vdd 310) is formed at the same level as the PMOS 112, it is possible to reduce the cell height.

In some embodiments, the power supply line Vdd 310 is made of the same material as the source/drain contact 235 of the PMOS 112. In other embodiments, the power supply line Vss 320 is made of a different material than the source/drain contact 130 of the NMOS 111. In some embodiments, the power supply line Vss 320 is one or more layers of Co, Ni, W, Ti, Ta, Cu, Al, TiN and TaN, or any other suitable material.

Figure 6:
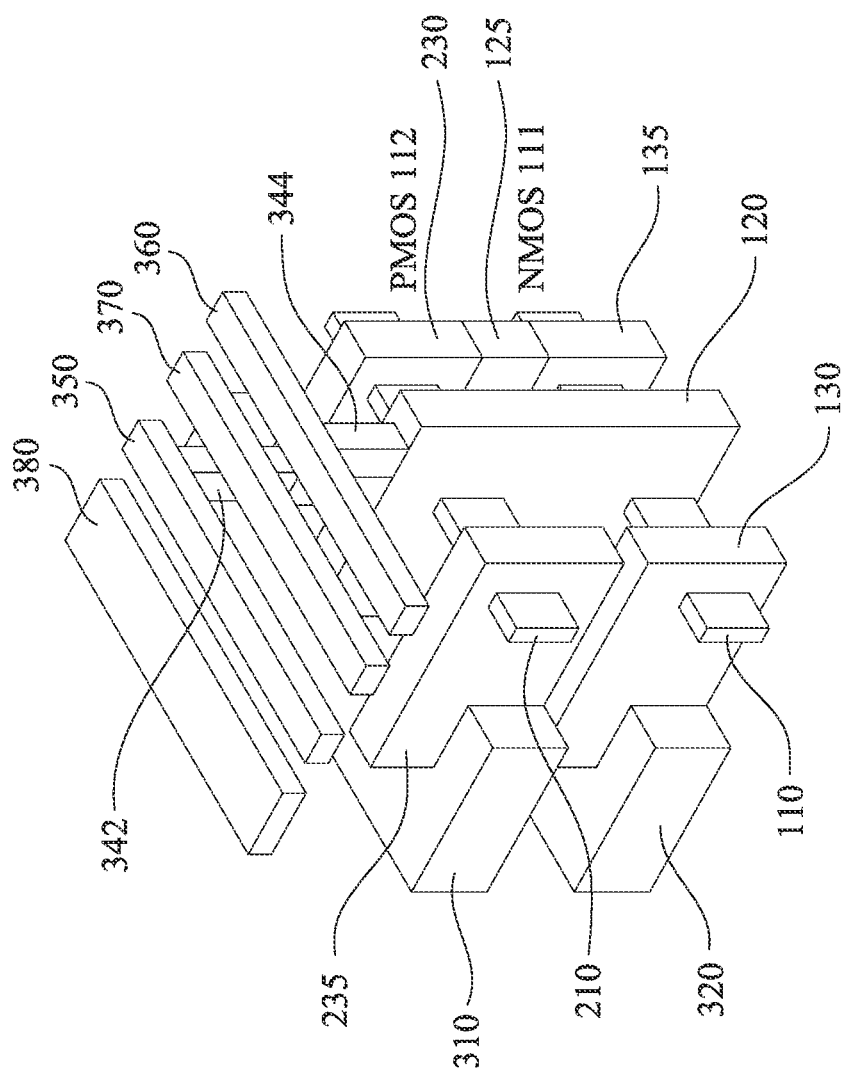
FIG. 6 shows a schematic view of a vertically arranged complementary FET (CFET) according to an embodiment of the present disclosure.

FIG. 6 shows a perspective view of a CFET according to another embodiment of the present disclosure. Material, configuration, dimensions and/or processes the same as or similar to the foregoing embodiments described with respect to FIGS. 2A-5 may be employed in the following embodiments, and detailed explanation thereof may be omitted.

In FIG. 6, the CFET includes a NMOS 111 and a PMOS 112 disposed above the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIG. 6, the source contact 130 of the NMOS 111 is coupled to the power supply line Vss 320 disposed at the same layer as the source contact 130, and the drain contact 235 of the PMOS 112 is coupled to the power supply line Vdd 310 disposed at the same layer as the drain contact 235. The power supply line Vss 320 is located at the same level as the NMOS 111 (source/drain contact layer) and is directly connected to the source (source region of the fin 110) of the NMOS 111, and the power supply line Vdd 310 is located at the same level as the PMOS 112 (source/drain contact layer) and is directly connected to the drain (drain region of the fin 210) of the PMOS 112. With this structure, it is possible to remove via formation processes (e.g., 330 and 340). In FIG. 6, since the power supply lines Vdd 310 and Vss 320 are formed at the same level as the PMOS 112 and NMOS 111, respectively, an additional signal line 380 can be utilized and it is possible to reduce the cell height because the signal line 380 is narrower than the power supply line.

Figure 7:
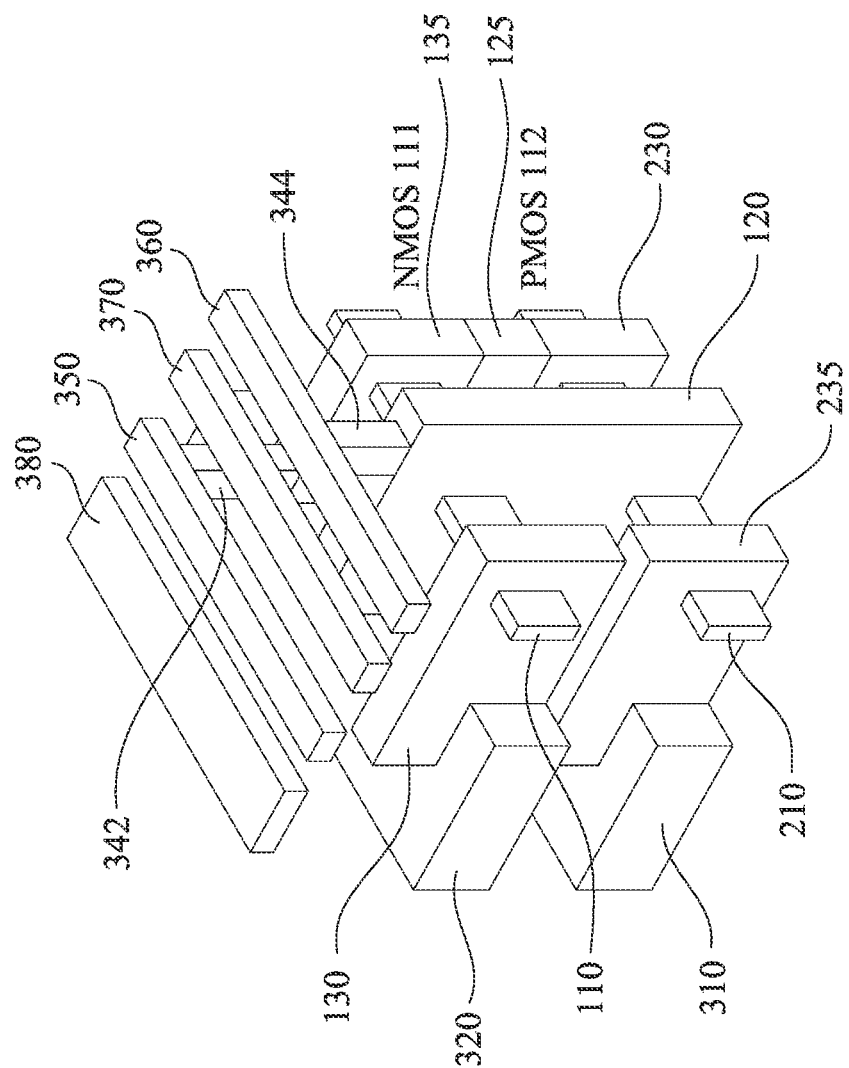
FIG. 7 shows a schematic view of a vertically arranged complementary FET (CFET) according to an embodiment of the present disclosure.

FIG. 7 shows a perspective view of a CFET according to another embodiment of the present disclosure. Material, configuration, dimensions and/or processes the same as or similar to the foregoing embodiments described with respect to FIGS. 2A-6 may be employed in the following embodiments, and detailed explanation thereof may be omitted.

In FIG. 7, the CFET includes a NMOS 111 and a PMOS 112 disposed below the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIG. 7, the source contact 130 of the NMOS 111 is coupled to the power supply line Vss 320 disposed at the same layer as the source contact 130, and the drain contact 235 of the PMOS 112 is coupled to the power supply line Vdd 310 disposed at the same layer as the drain contact 235. The power supply line Vss 320 is located at the same level as the NMOS 111 (source/drain contact layer) and is directly connected to the source (source region of the fin 110) of the NMOS 111, and the power supply line Vdd 310 is located at the same level as the PMOS 112 (source/drain contact layer) and is directly connected to the drain (drain region of the fin 210) of the PMOS 112. With this structure, it is possible to remove via formation processes (e.g., 330 and 340). In FIG. 7, since the power supply lines Vdd 310 and Vss 320 are formed at the same level as the PMOS 112 and NMOS 111, respectively, an additional signal line 380 can be utilized and it is possible to reduce the cell height because the signal line 380 is narrower than the power supply line.

Figure 8:
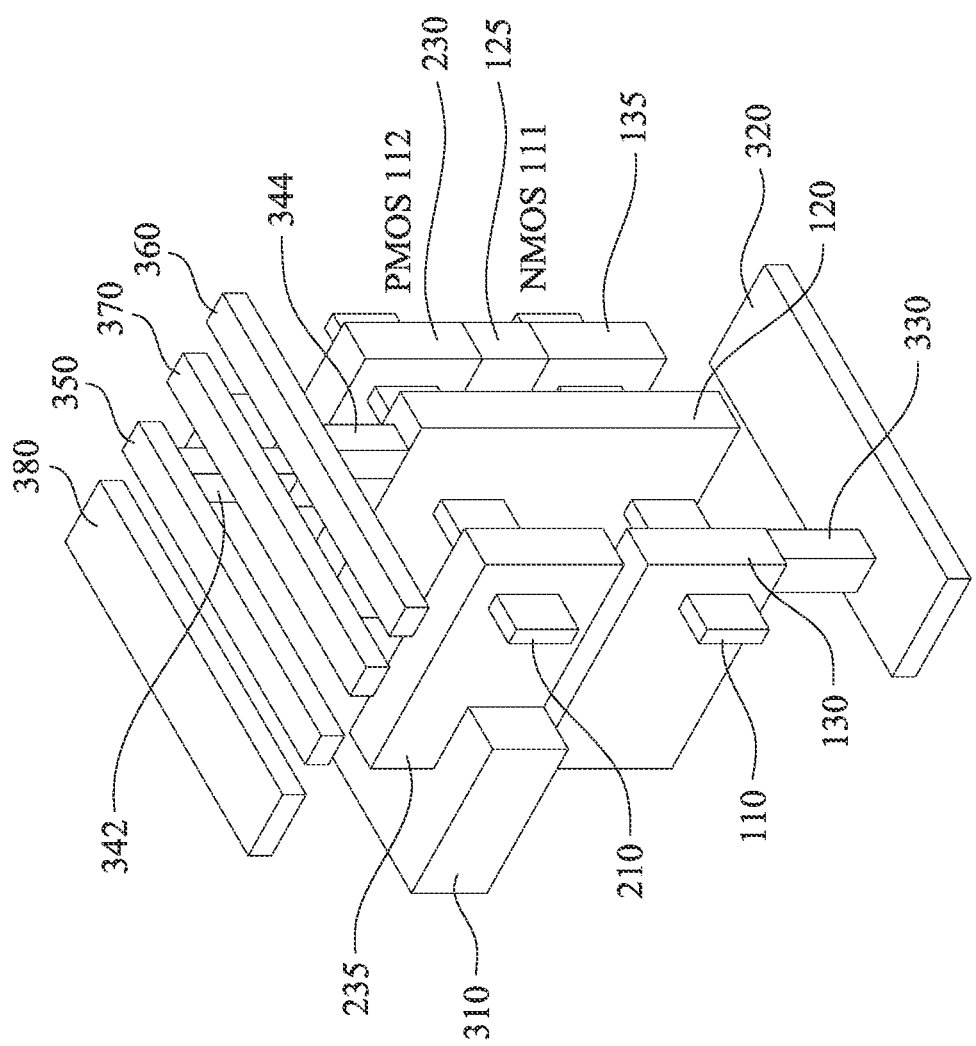
FIG. 8 shows a schematic view of a vertically arranged complementary FET (CFET) according to an embodiment of the present disclosure.

FIG. 8 shows a perspective view of a CFET according to another embodiment of the present disclosure. Material, configuration, dimensions and/or processes the same as or similar to the foregoing embodiments described with respect to FIGS. 2A-7 may be employed in the following embodiments, and detailed explanation thereof may be omitted.

In FIG. 8, the CFET includes a NMOS 111 and a PMOS 112 disposed above the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments. In other embodiments, no bar contact is used and the drain contact 135 of the NMOS 111 and the source contact 230 of the PMOS 112 are directly connected, or are formed as a single continuous layer.

As shown in FIG. 8, the source contact 130 of the NMOS 111 is coupled to the power supply line Vss 320 below the NMOS 111 through a bottom via contact 330, while the drain contact 235 of the PMOS 112 is coupled to the power supply line Vdd 310 disposed at the same level as the drain contact 235. The power supply line Vdd 310 is located at the same level as the PMOS 112 (source/drain contact layer) and is directly connected to the drain (drain region of the fin 210) of the PMOS 112, and the power supply line Vss 320 is located below the NMOS 111. With this structure, it is possible to remove a via formation process (e.g., 340).

In some embodiments, since the Vss 320 and Vdd 310 are located below MO wiring layers (the first metal wiring layer above the CFET), an extra wiring line, e.g., a signal line 380, can be used in a standard cell for electrical connection (routing) and it is possible to reduce the cell height because the signal line 380 is narrower than the power supply line.

Figure 9:
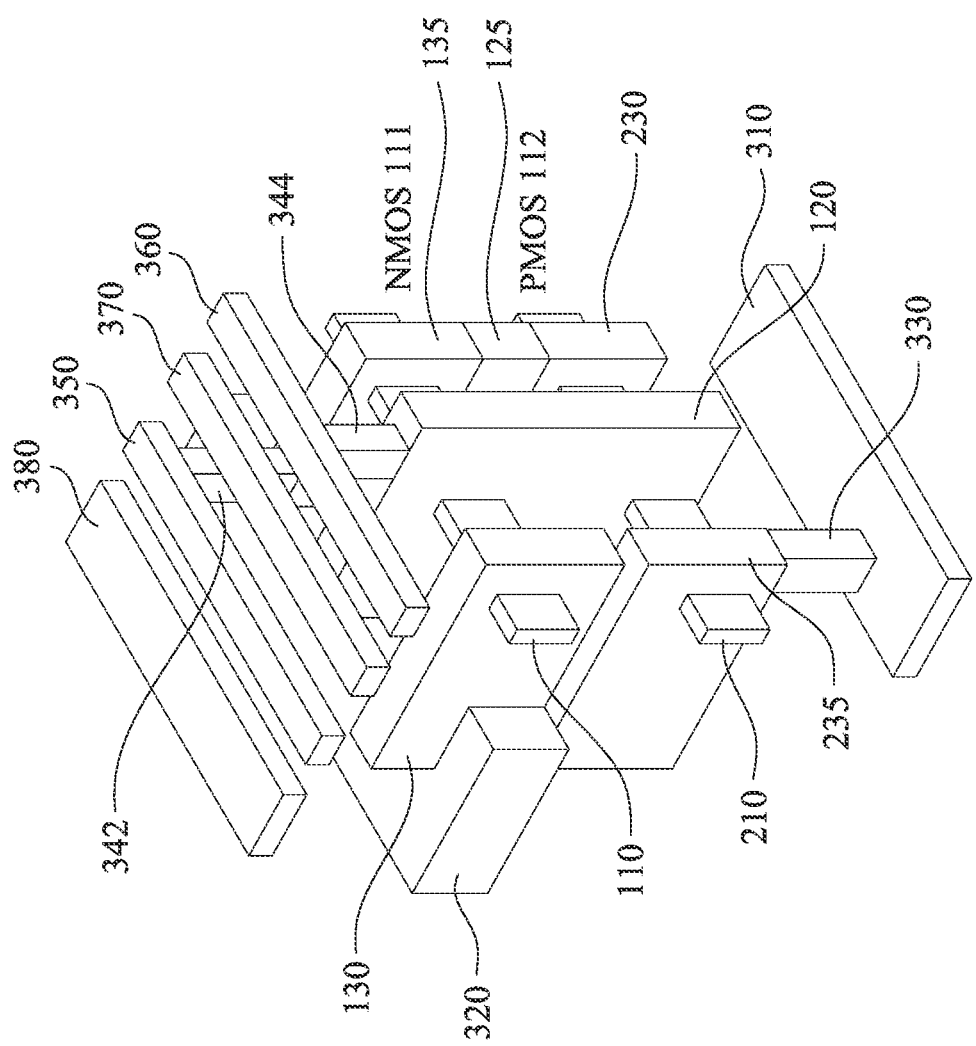
FIG. 9 shows a schematic view of a vertically arranged complementary FET (CFET) according to an embodiment of the present disclosure.

FIG. 9 shows a perspective view of a CFET according to another embodiment of the present disclosure. Material, configuration, dimensions and/or processes the same as or similar to the foregoing embodiments described with respect to FIGS. 2A-8 may be employed in the following embodiments, and detailed explanation thereof may be omitted.

In FIG. 9, the CFET includes a NMOS 111 and a PMOS 112 disposed below the NMOS 111. The NMOS 111 includes a fin 110 having a channel region and source/drain regions, a gate 120 wrapping around the channel region of the fin, a source contact 130 wrapping around the source region of the fin and a drain contact 135 wrapping around the drain region of the fin. The PMOS 112 includes a fin 210 having a channel region and source/drain regions, the gate 120 wrapping around the channel region of the fin, a source contact 230 wrapping around the source region of the fin and a drain contact 235 wrapping around the drain region of the fin. The gate is shared by the NMOS 111 and PMOS 112. The gate incudes a gate dielectric layer, one or more work function adjustment layers and a body gate electrode layer in some embodiments. The drain contact 135 of the NMOS 111 and the source contact 230 of the PMOS 112 are connected by a bar contact 125 in some embodiments.

As shown in FIG. 9, the source contact 130 of the NMOS 111 is coupled to the power supply line Vss 320 disposed at the same level as the source contact 130, while the drain contact 235 of the PMOS 112 is coupled to the power supply line Vdd 310 below the PMOS 112 through a bottom via contact 330. The power supply line Vss 320 is located at the same level as the NMOS 111 (source/drain contact layer) and is directly connected to the source (source region of the fin 110) of the NMOS 111, and the power supply line Vdd 310 is located below the PMOS 112. With this structure, it is possible to remove a via formation process (e.g., 340).

In some embodiments, since the Vss 320 and Vdd 310 are located below MO wiring layers (the first metal wiring layer above the CFET), an extra wiring line, e.g., a signal line 380, can be used in a standard cell for electrical connection (routing or a signal line) and it is possible to reduce the cell height because the signal line 380 is narrower than the power supply line.

FIGS. 10A-14D show MO wiring layouts (top view) according to embodiments of the present disclosure. The MO wiring is the lowest metal wiring layer above the CFET.

In some embodiments, the CMOS cell is one of the standard cells (cell library) and has a standard cell height. The cell height is determined by, for example, the number of fins and the number of MO wirings.

FIG. 10A shows a layout where both power supply lines Vdd 310 and Vss 320 are buried below the CFET. FIG. 10B corresponds to FIGS. 2A-2C and 3A-3C, and FIG. 10C corresponds to FIGS. 3A and 4.

In FIG. 10A, cell height H1 is four times the pitch T of the signal lines included in one standard cell along the Y direction, which is called a 4 T (tracks) cell height. In FIG. 10B, by placing one of the power supply lines (e.g., Vdd 310) on MO layer, while the other of the power supply lines (e.g., VSS) is placed below the CFET, it is possible to reduce the cell height H2 from 4 T to 3.5 T. Similarly, in FIG. 10C, by placing one of the power supply lines (e.g., Vdd 310) on MO layer, while the other of the power supply lines (e.g., VSS) is placed at the same level as the NMOS 111 or PMOS 112 of the CFET, it is possible to reduce the cell height from 4 T (tracks) to 3.5 T. In some embodiments, the power supply line located at the MO wiring layer has the same width as the remaining signal lines. In other embodiments, as shown in FIGS. 2A and 3A, the power supply line located at the MO wiring layer has a broader width than the remaining signal lines and in such a case, the cell height H2 is 3.5 T<H2≤4 T.

Figures 11A, 11B, 11C:
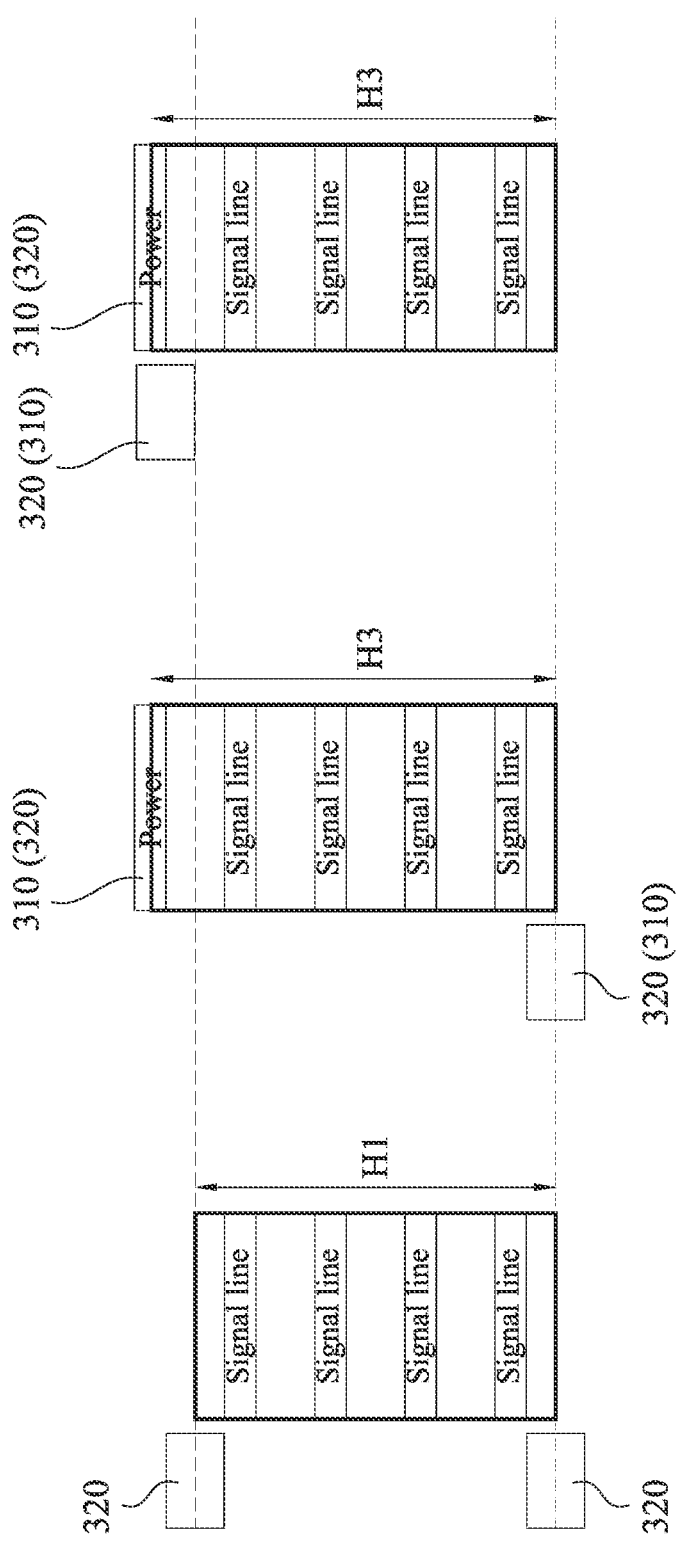
FIGS. 11A, 11B and 11C show MO wiring layouts according to an embodiment of the present disclosure.

FIG. 11A shows a layout where both power supply lines Vdd 310 and Vss 320 are buried below the CFET, similar to FIG. 10A. In FIG. 11B, one of the power supply lines (e.g., Vdd 310) is disposed at the MO wiring layer as an additional wiring, while the other of the power supply lines (e.g., Vss 320) is placed below the CFET. In such a case, the cell height H3 is 4.5 T. Similarly, in FIG. 11C, one of the power supply lines (e.g., Vdd 310) is disposed at the MO wiring layer as an additional wiring and the other of the power supply lines (e.g., Vss 320) is disposed at the same level as the NMOS 111 or PMOS 112 of the CFET. In such a case, the cell height H3 is 4.5 T.

Figures 12A, 12B, 12C:
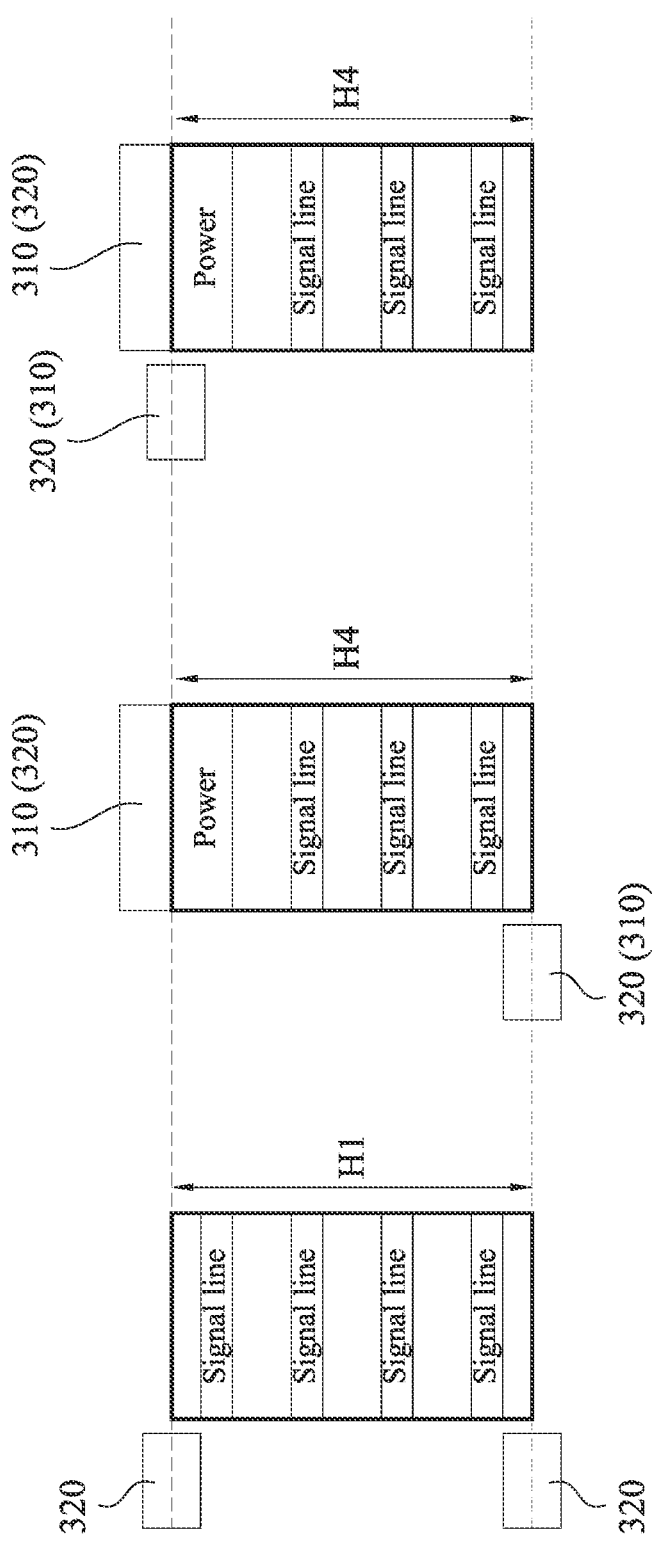
FIGS. 12A, 12B and 12C show MO wiring layouts according to an embodiment of the present disclosure.

FIG. 12A shows a layout where both power supply lines Vdd 310 and Vss 320 are buried below the CFET. FIG. 12B corresponds to FIGS. 2A-2C and 3A-3C, and FIG. 12C corresponds to FIGS. 3A and 4.

In FIG. 12A, cell height H1 is four times the pitch T of the signal lines included in one standard cell along the Y direction, which is called a 4 T (tracks) cell height, similar to FIG. 10A. In FIG. 12B, one of the power supply lines (e.g., Vdd 310) is disposed on MO layer, and the other of the power supply lines (e.g., VSS) is placed below the CFET. In some embodiments, the power supply line located at the MO wiring layer has a broader width than the remaining signal lines, e.g., four times to maintain the space between adjacent wirings, and in such a case, the cell height H4 is 4 T. Similarly, in FIG. 12C, one of the power supply lines (e.g., Vdd 310) is disposed on MO layer, and the other of the power supply lines (e.g., VSS) is placed at the same level as the NMOS 111 or PMOS 112 of the CFET. When the width of the power supply line is, for example, four times the width of the signal limes, the cell height H4 is 4 T.

Figures 13A, 13B, 13C:
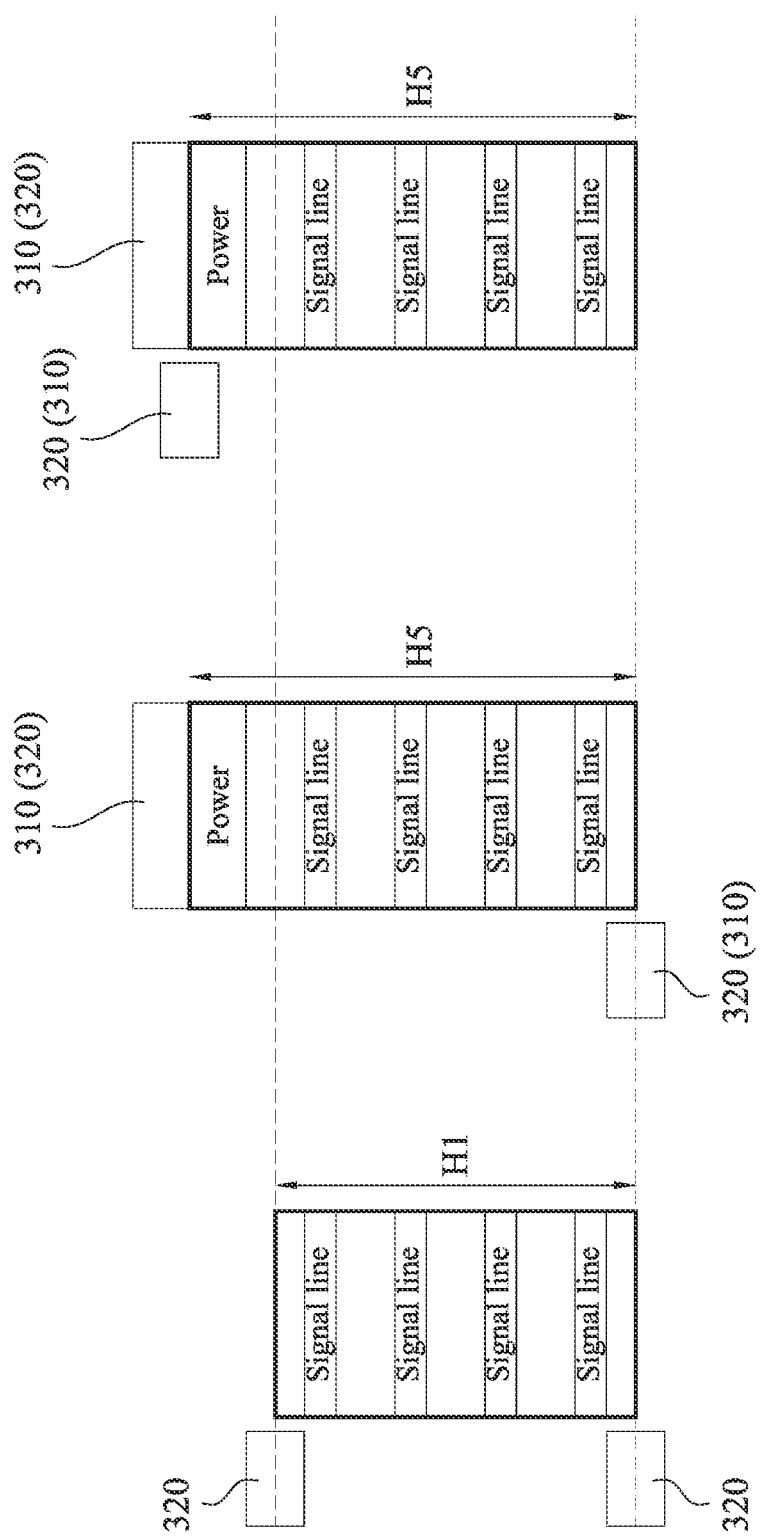
FIGS. 13A, 13B and 13C show MO wiring layouts according to an embodiment of the present disclosure.

FIG. 13A shows a layout where both power supply lines Vdd 310 and Vss 320 are buried below the CFET, similar to FIG. 10A. In FIG. 13B, one of the power supply lines (e.g., Vdd 310) is disposed at the MO wiring layer as an additional wiring, while the other of the power supply lines (e.g., Vss 320) is placed below the CFET. When the width of the power supply line is, for example, four times the width of the signal limes, the cell height H5 is 4.5 T. Similarly, in FIG. 13C, one of the power supply lines (e.g., Vdd 310) is disposed at the MO wiring layer as an additional wiring and the other of the power supply lines (e.g., Vss 320) is disposed at the same level as the NMOS 111 or PMOS 112 of the CFET. When the width of the power supply line is, for example, four times the width of the signal limes, the cell height H5 is 4.5 T.

FIG. 14A shows a layout where both power supply lines Vdd 310 and Vss 320 are buried below the CFET having a 3 T cell height having three signal lines in one cell. In FIG. 14B, an extra power supply line for one of the power supply lines (e.g., Vdd 310) having a wider width than the signal lines is disposed at the MO wiring layer, and the other of the power supply lines (e.g., Vss 320) is disposed at the same level as the NMOS 111 or PMOS 112 of the CFET (see, FIGS. 4 and 5). In some embodiments, the extra power supply line located at the MO wiring layer has a width four times the width of the signal lines to maintain the space between adjacent wirings. In such a case, the cell height is 4 T. In FIG. 14C, one of the power supply lines (e.g., Vdd 310) is disposed at the same level as the NMOS 111 or PMOS 112 of the CFET, and the other of the power supply lines (e.g., Vss 320) is disposed below the CFET (see FIGS. 8 and 2A), and the cell height is 4 T. In FIG. 14D, both the power supply lines are disposed at the same level as the NMOS 111 or PMOS 112 of the CFET (see FIGS. 6 and 7), and the cell height is 4 T.

FIGS. 15A-28B shows sequential manufacturing operations for buried power supply wirings according to an embodiment of the present disclosure. It is understood that additional operations can be provided before, during, and after the processes shown by FIGS. 15A-28B, and some of the operations described below can be replaced or eliminated, for additional embodiments of the method. The order of the operations/processes may be interchangeable. The semiconductor layers and substrate are crystalline, unless otherwise explained. Material, configuration, dimensions and/or processes the same as or similar to the foregoing embodiments described with respect to FIGS. 1-14D may be employed in the following embodiments, and detailed explanation thereof may be omitted.

Figure 15A:
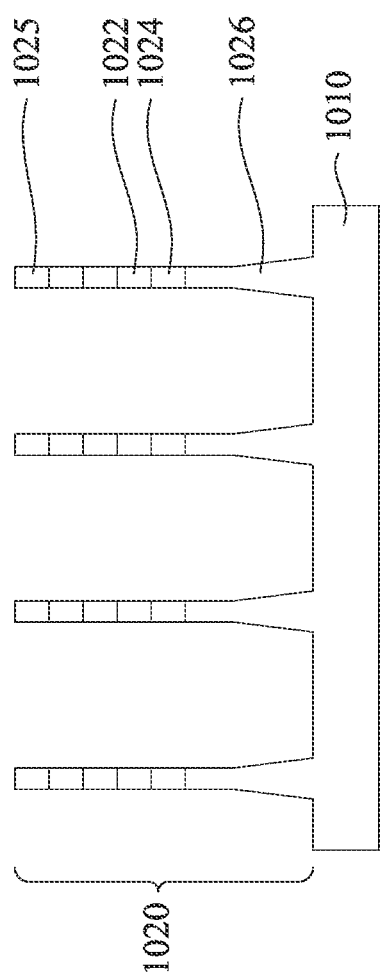
FIGS. 15A, 15B and 15C show various views illustrating manufacturing operations of a CFET according to an embodiment of the present disclosure.

As shown in FIG. 15A, one or more fin structures 1020 including first semiconductor layer 1022 and second semiconductor layer 1024 are stacked alternately over a fin bottom structure 1026 formed over a substrate 1010. In some embodiments, the substrate 1010 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 1010 may include an epitaxial layer (epi-layer), which may be strained for performance enhancement, and/or may include a silicon-on-insulator (SOI) structure.

In some embodiments, two second semiconductor layers and two first semiconductor layers are epitaxially formed over the substrate alternately, and then patterned into fin structures 1020.

In some embodiments, the first semiconductor layers 1022 are made of Si and the second semiconductor layers 1024 are made of SiGe. In other embodiments, the first semiconductor layers 1022 are made of SiGe and the second semiconductor layers 1024 are made of Si. In certain embodiments, the first semiconductor layers 1022 are made of SiGe and the second semiconductor layers 1024 are made of SiGe having a different Ge concentration than the first semiconductor layers 1022. The thickness of the first semiconductor layers 1022 is in a range from about 5 nm to about 30 nm in some embodiments, and is in a range from about 10 nm to about 20 nm in other embodiments, depending on the design and device requirements. The thickness of the second semiconductor layers 1024 is in a range from about 10 nm to about 50 nm in some embodiments, and is in a range from about 15 nm to about 30 nm in other embodiments, depending on the design and device requirements.

The fin structures 1020 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

Figure 15B:
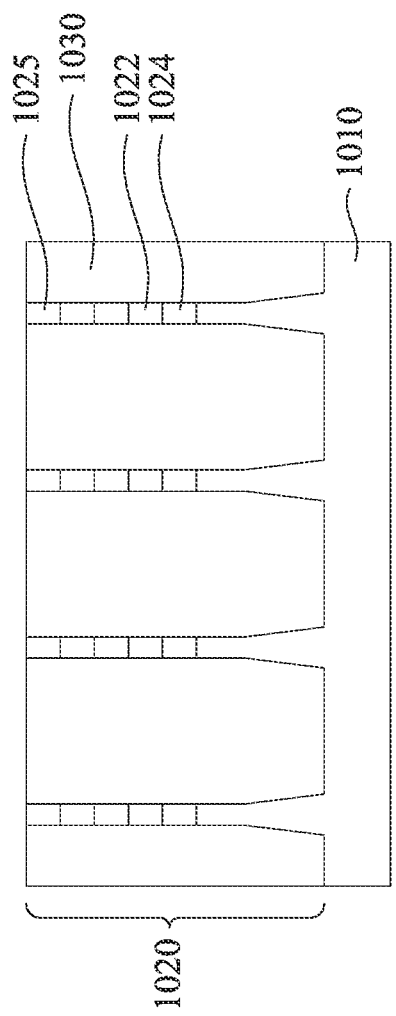
Figure 15C:
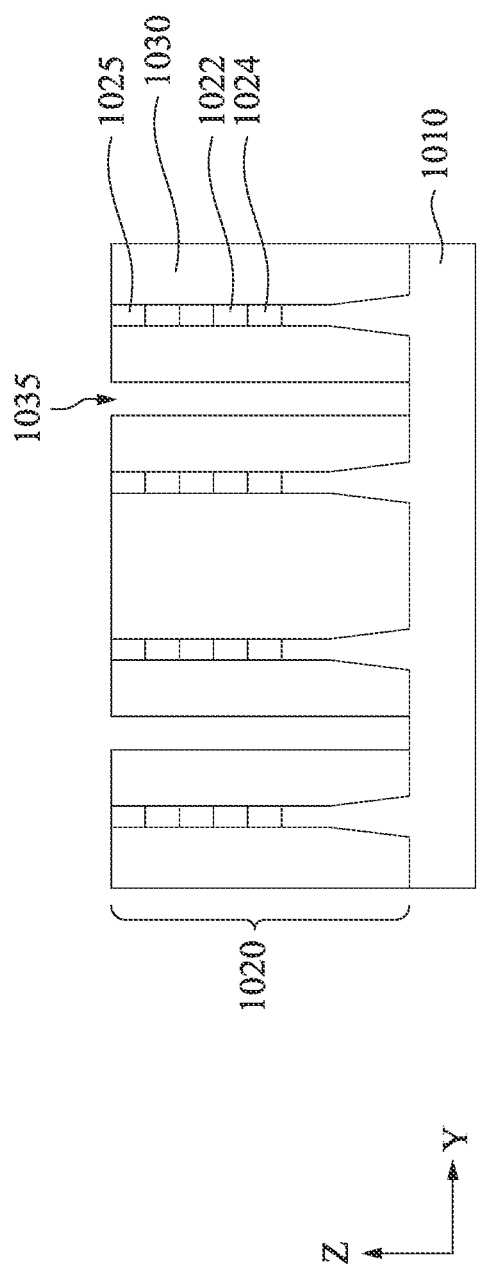

In other embodiments, the fin structures 1020 can be patterned by using a hard mask pattern 1025 as an etching mask. In some embodiments, the hard mask pattern 1025 includes a first mask layer and a second mask layer disposed on the first mask layer. In some embodiments, the first mask layer is a pad oxide layer made of a silicon oxide, which can be formed by a thermal oxidation, and the second mask layer is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 1025 by using patterning operations including photo-lithography and etching. Then, the first semiconductor layers 1022, the second semiconductor layers 1024 and the substrate 1010 are patterned by using the hard mask pattern 1025 as an etching mask into fin structures 1020, extending in the X direction. In FIGS. 15A-15C, four fin structures 1020 are arranged in the Y direction. But the number of the fin structures is not limited to, and may one, two three or five or more. In some embodiments, one or more dummy fin structures are formed on both sides of the fin structures 1020 to improve pattern fidelity in the patterning operations.

Then, as shown in FIG. 15B, an insulating layer for shallow trench isolation (STI) is formed to embed the fin structures 1020 therein. The insulating layer 1030 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 1030 can be formed by one or more layers of SOG, SiO, SiON, SiOCN or fluorine-doped silicate glass (FSG) in some embodiments. Prior to forming the isolation insulating region 1030, one or more liner layers (not shown) are formed over the substrate 1010 and sidewalls of the bottom part of the fin structures 1020, in some embodiments.

Next as shown in FIG. 15C, trench openings 1035 are formed in the isolation insulating layer 1030 by using one or more lithography and etching operations.

In some embodiments, after a liner insulating layer 1040 is formed in the trench opening, a conductive material 1050 is filled in the trench opening as shown in FIG. 16A. The liner layer 1040 includes one or more of silicon oxide, silicon nitride, SiON, SiOC, SiOCN or any other suitable material. The conductive material 1050 includes one or more conductive materials, such as doped poly silicon, W, Cu, Ti, Ag, Al, TiAl, TiAlN, TaC, TaCN, TaSiN, Mn, Co, Pd, Ni, Re, Jr, Ru, Pt, and Zr, formed by ALD, PVD, CVD, plating or any other suitable methods. After the conductive material 1050 is formed a planarization operation, such as a chemical mechanical polishing (CMP) operation is performed.

Figure 16C:
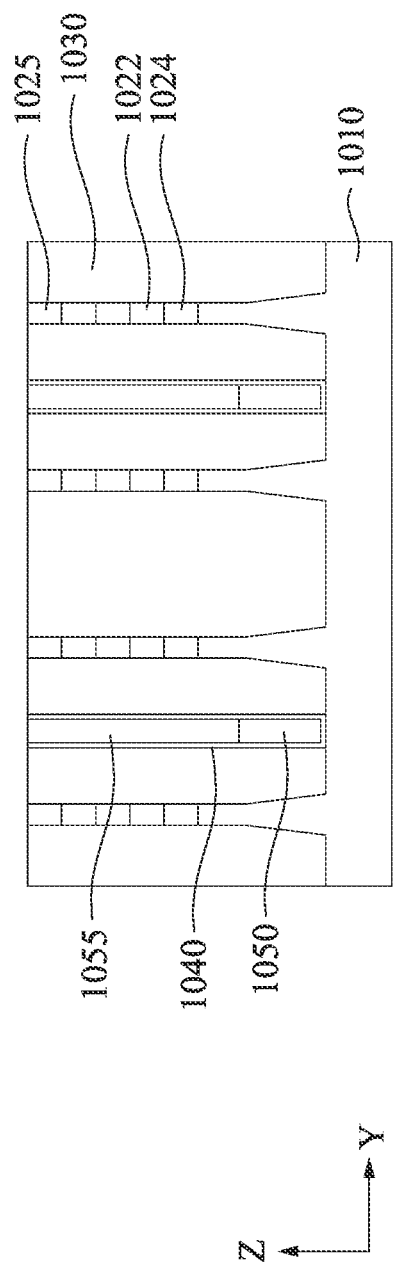

Subsequently, as shown in FIG. 16B, the conductive material 1050 is recessed down to a given depth to form upper openings 1045. The upper openings 1045 are filled with an insulating material 1055 as shown in FIG. 16C. The insulating material 1055 includes one or more of silicon oxide, silicon nitride, SiON, SiOC, SiOCN or any other suitable material.

After the insulating material 1055 is formed, an etch back operation is performed to expose the upper portion of the fin structures 1020, as shown in FIGS. 17A and 17B. In some embodiments, the isolation insulating layer 1030, the liner layer 1040 and the insulating material 1055 are recessed using a single etch process, or multiple etch processes, including a dry etch, a chemical etch, or a wet cleaning process. In some embodiments, the hard mask pattern 1025 is also removed.

As shown in FIG. 17A, part of the insulating material 1055 remains on the conductive material 1050, which corresponds to a buried power supply wiring 310 or 320. FIG. 17C shows a plan view after the buried power supply wirings 1050 (310 or 320) are formed. In some embodiments, the buried power supply wirings 1050 are cut into pieces of wirings for different potentials.

Next, as shown in FIGS. 18A-18C, one or more gate structures 1060 are formed. In some embodiments, the gate structures 1060 are sacrificial gate structures, which are subsequently replaced with metal gate electrodes. In some embodiments, the sacrificial gate structure 1060 includes a structure gate dielectric layer 1062 and a structure gate electrode layer 1064. Further, gate sidewall spacers 1065 are formed on opposing side faces of the sacrificial gate electrode.

A blanket layer of the dummy gate dielectric layer is formed over the exposed fin structures. The dummy gate dielectric layer includes one or more layers of silicon oxide, silicon nitride and/or silicon oxynitride. A dummy gate electrode layer is then deposited on the dummy gate dielectric layer, such that the fin structures are fully embedded in the dummy gate electrode layer. The dummy gate electrode layer includes silicon such as poly crystalline silicon or amorphous silicon. In some embodiments, the dummy gate electrode layer is subjected to a planarization operation. The dummy gate dielectric layer 1062 and the dummy gate electrode layer 1064 are deposited using CVD, including LPCVD and PECVD, PVD, ALD, or other suitable process. Subsequently, a mask layer is formed over the dummy gate electrode layer. The mask layer includes a pad SiN layer and a silicon oxide mask layer in some embodiments. Next, a patterning operation is performed on the mask layer, thereby forming the hard mask pattern, and the dummy gate electrode layer is patterned into the dummy gate electrodes, as shown in FIGS. 18A and 18B. The dummy gate structures are formed over a portion of the fin structures, which is to be a channel region. The dummy gate structures define the channel region of the CFET.

Figure 19A:
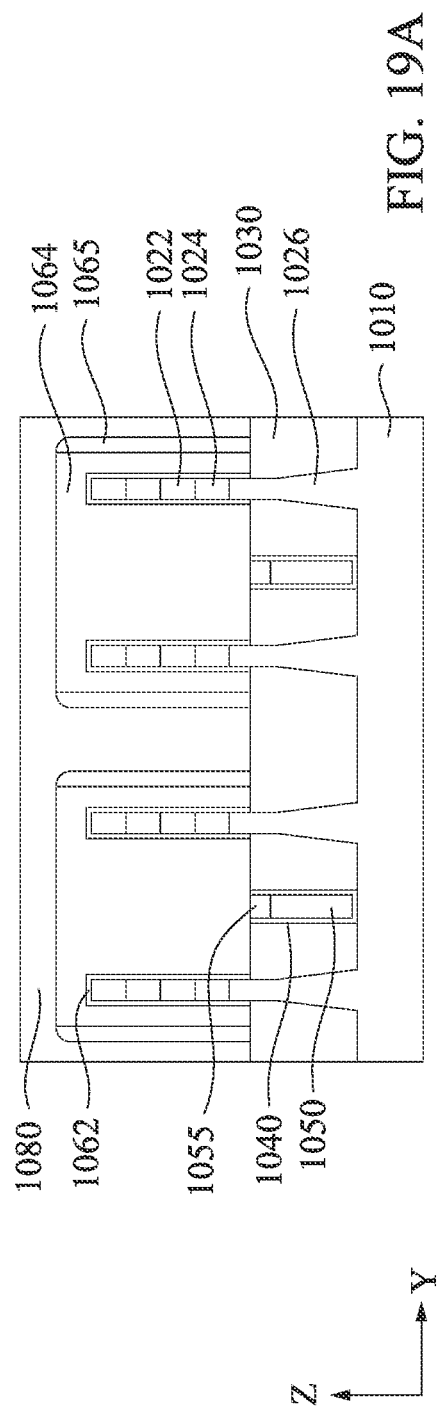
FIGS. 19A and 19B show various views illustrating manufacturing operations of a CFET according to an embodiment of the present disclosure.
Figure 19B:
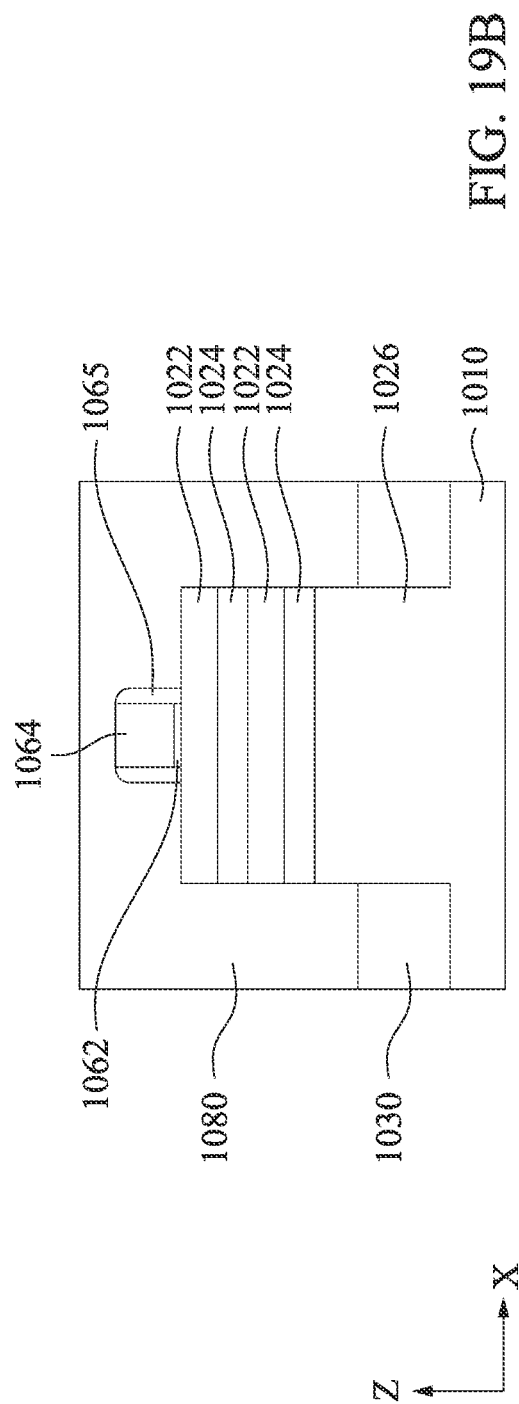

After the sacrificial gate structures 1060 are formed, an interlayer dielectric (ILD) layer 1080 is formed, as shown in FIGS. 19A and 19B. In some embodiments, before forming the ILD layer, an etch stop layer (not shown) is formed. The etch stop layer is made of silicon nitride or a silicon nitride-based material (e.g., SiON, SiCN or SiOCN). The materials for the ILD layer include compounds comprising Si, 0, C and/or H, such as silicon oxide, SiCOH and SiOC. Organic materials, such as polymers, may be used for the ILD layer 1080. After the ILD layer 1080 is formed, a planarization operation, such as an etch-back process and/or a chemical mechanical polishing (CMP) process, is performed to expose the sacrificial gate electrode layer 1064.

Then, the sacrificial gate electrode 1064 and the sacrificial gate dielectric layer 1062 are removed, thereby forming gate spaces 1068 as shown in FIGS. 20A and 20B. The sacrificial gate structures 1064 can be removed using plasma dry etching and/or wet etching. When the sacrificial gate electrodes 1064 are polysilicon, a wet etchant such as a TMAH solution can be used to selectively remove the sacrificial gate electrodes 1064. The dummy gate dielectric layer 1062 is also removed by wet and/or dry etching.

After the fin structures are exposed in the gate spaces 1068, the second semiconductor layers 1024 are removed, thereby forming semiconductor wire structures 1022 (first semiconductor layers), as shown in FIGS. 21A and 21B.

When the first semiconductor layers 1022 are Si and the second semiconductor layers 1024 are SiGe, the second semiconductor layers 1024 can be selectively removed using a wet etchant such as, but not limited to, ammonium hydroxide (NH$_4$OH), tetramethylammonium hydroxide (TMAH), ethylenediamine pyrocatechol (EDP), potassium hydroxide (KOH) solutions, a hydrochloric acid (HCl) solution, or a hot ammonia solution. As shown in FIGS. 21B, the second semiconductor layers 1024 remain in the source/drain regions.

Figure 22C:
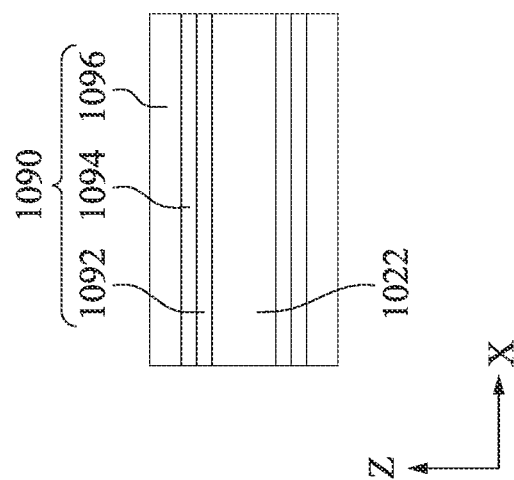
FIGS. 22A, 22B and 22C show various views illustrating manufacturing operations of a CFET according to an embodiment of the present disclosure.
Figure 22A:
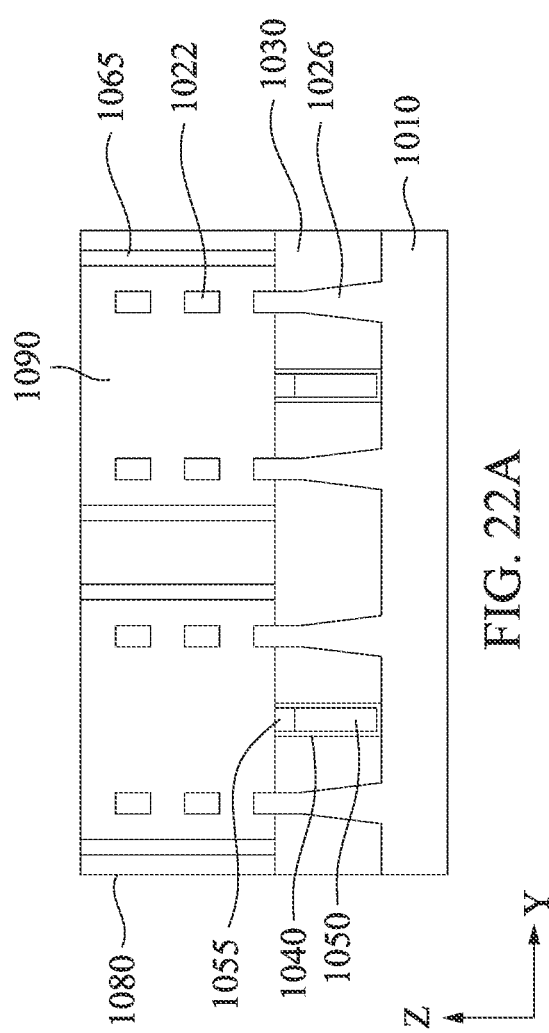
Figure 22B:
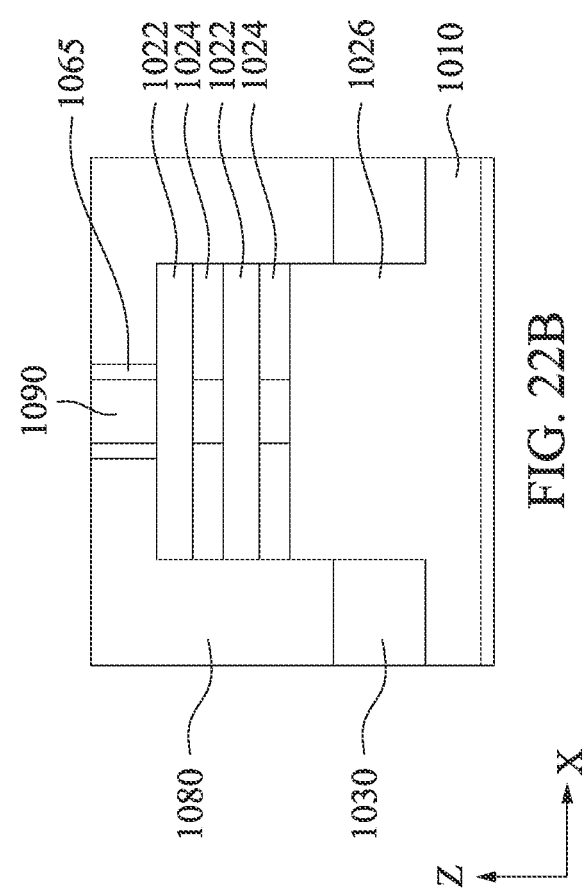

Then, as shown in FIGS. 22A-22C, a metal gate structure 1090 is formed. After the semiconductor wires (fins) of the first semiconductor layers 1022 as channel regions are formed, a gate dielectric layer 1092 is formed around each channel regions (wires or fins of the first semiconductor layers 1022), and a gate electrode layer is formed on the gate dielectric layer 1092.

In certain embodiments, the gate dielectric layer 1092 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 1092 includes an interfacial layer (not shown) formed between the channel layers and the dielectric material. The gate dielectric layer 1092 may be formed by CVD, ALD or any suitable method. In one embodiment, the gate dielectric layer 1092 is formed using a highly conformal deposition process such as ALD in order to ensure the formation of a gate dielectric layer having a uniform thickness around each channel layers.

The gate electrode layer 1096 is formed on the gate dielectric layer 1092 to surround each channel layer. The gate electrode layer 1096 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 1096 may be formed by CVD, ALD, electro-plating, or other suitable method. The gate electrode layer 1096 is also deposited over the upper surface of the first ILD layer 1080, and the gate dielectric layer 1092 and the gate electrode layer 1096 formed over the first ILD layer 1080 is then planarized by using, for example, CMP, until the top surface of the first ILD layer 1080 is revealed.

In certain embodiments of the present disclosure, one or more work function adjustment layers 1094 are interposed between the gate dielectric layer 1092 and the gate electrode layer 1096. The work function adjustment layer 1094 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer 1094, and for the p-channel FET, one or more of TiAlC, Al, TiAl, TaN, TaAlC, TiN, TiC and Co is used as the work function adjustment layer 1094. The work function adjustment layer 1094 may be formed by ALD, PVD, CVD, e-beam evaporation, or other suitable process.

After the metal gate structures are formed, a second ILD layer is formed by CVD or other suitable methods over the first ILD layer 1080. The material of the second ILD layer can be the same as or different from the first ILD layer. In the following figures the combination of the first ILD layer 1080 and the second ILD layer is referred to as an ILD layer 1085.

Figure 23A:
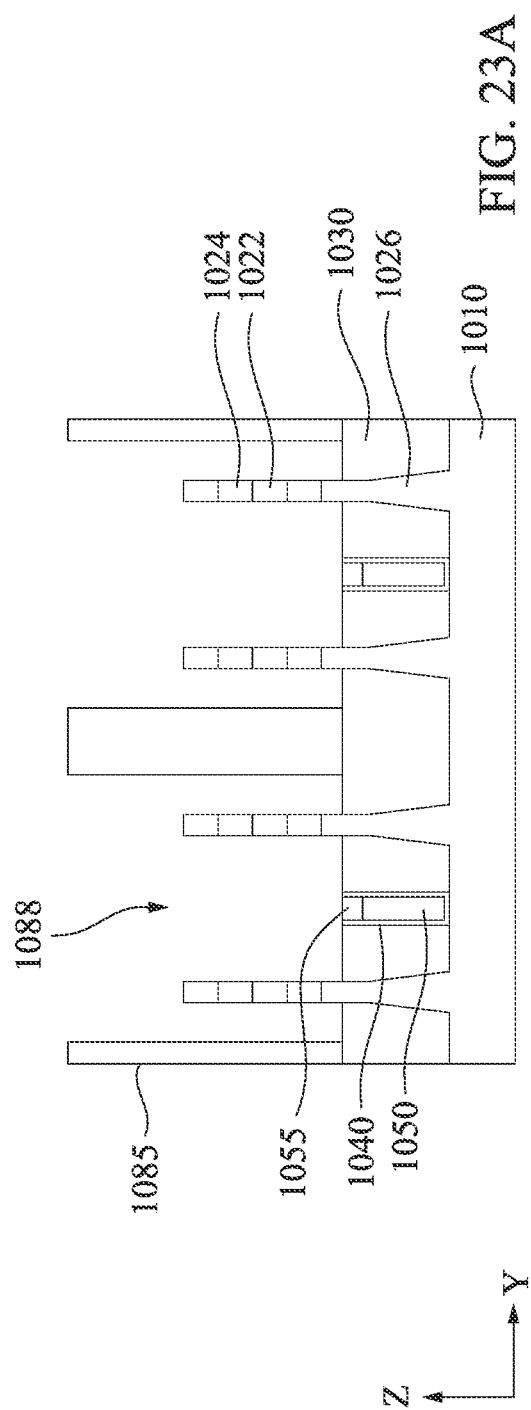
FIGS. 23A and 23B show various views illustrating manufacturing operations of a CFET according to an embodiment of the present disclosure.
Figure 23B:
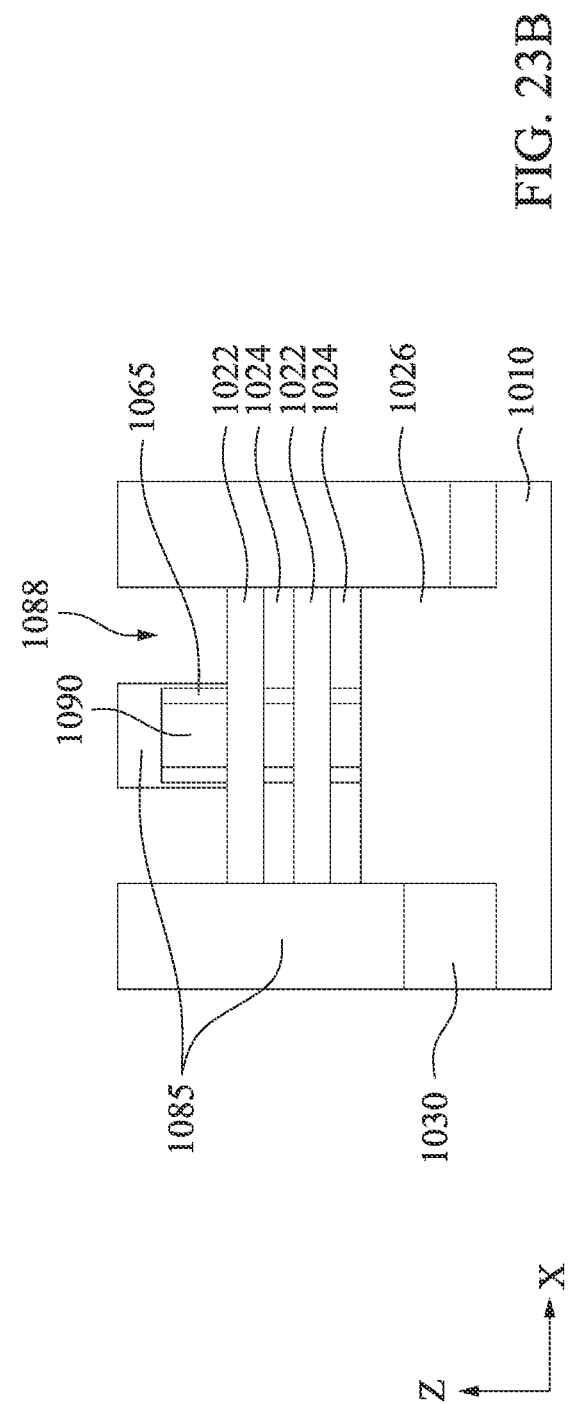

Then, as shown in FIGS. 23A and 23B, the ILD layer 1085 is patterned to expose part of the source/drain regions of the fin structure to form openings 1088 by using one or more lithography and etching operations.

Figure 24A:
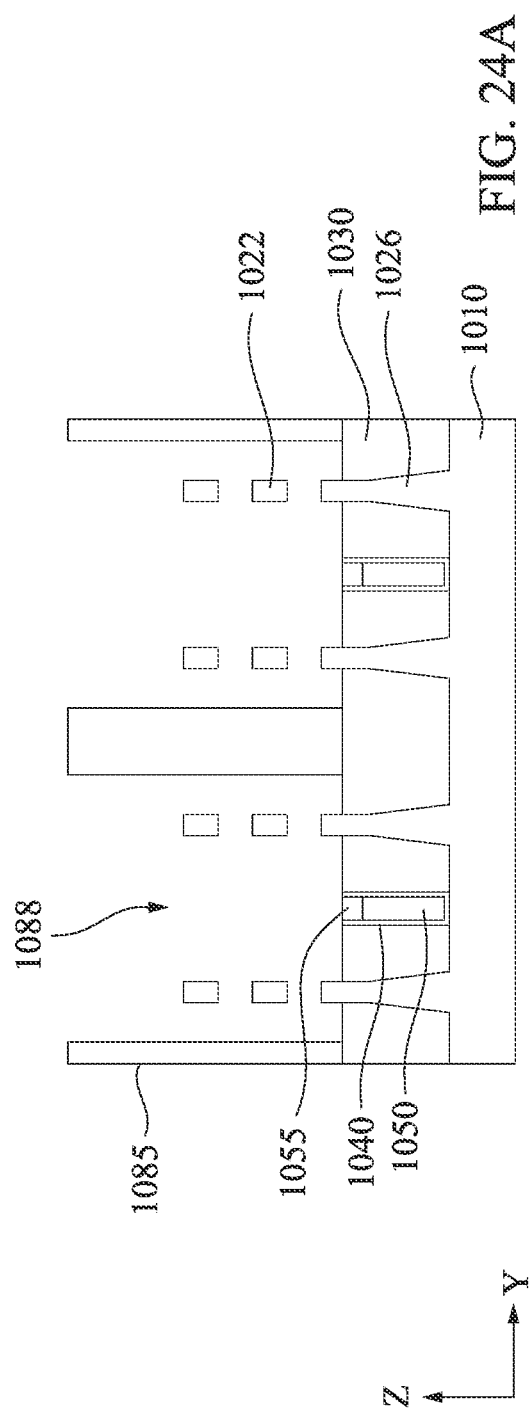
FIGS. 24A and 24B show various views illustrating manufacturing operations of a CFET according to an embodiment of the present disclosure.
Figure 24B:
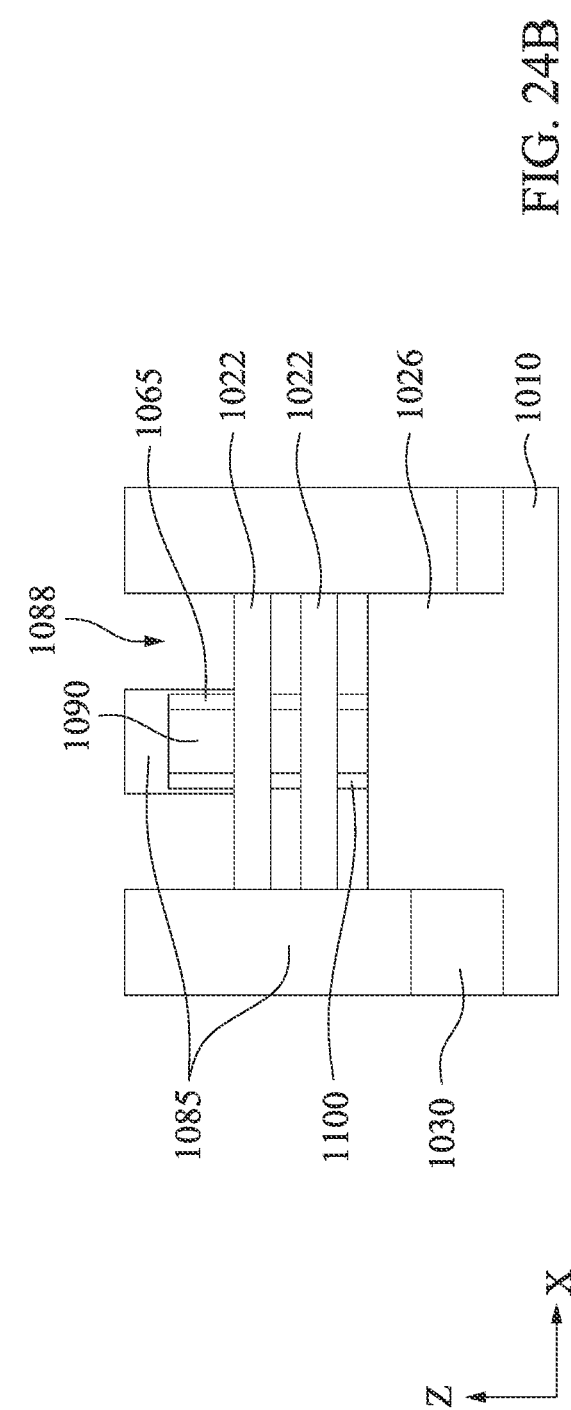

Subsequently, as shown in FIGS. 24A and 24B, the second semiconductor layers 1024 in the source/drain region are removed. When the first semiconductor layers 1022 are Si and the second semiconductor layers 1024 are SiGe, the second semiconductor layers 1024 can be selectively removed using a wet etchant such as, but not limited to, NH$_4$OH, TMAH, EDP, KOH solutions, a HCl solution, or a hot ammonia solution. In some embodiments, inner spacers 1100 are formed on end faces of the metal gate structure.

Figure 25C:
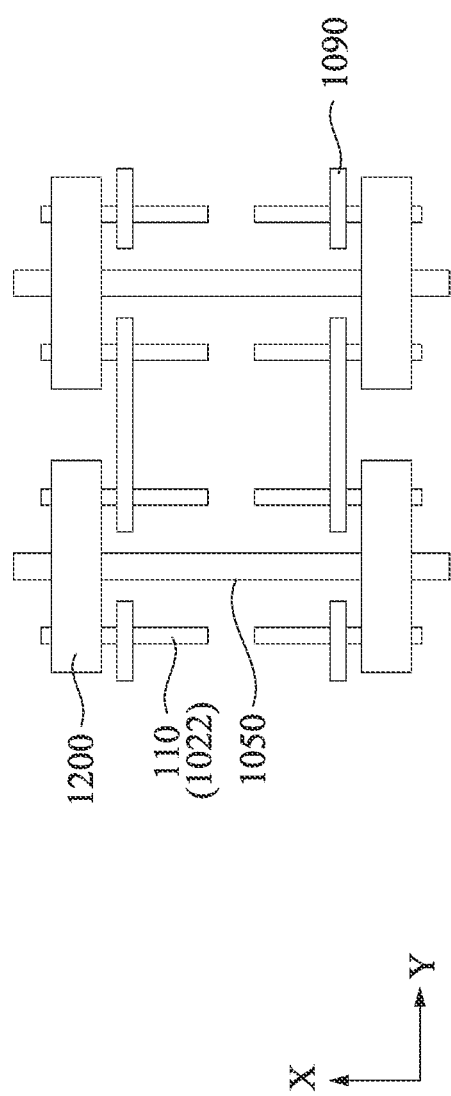
Figure 25D:
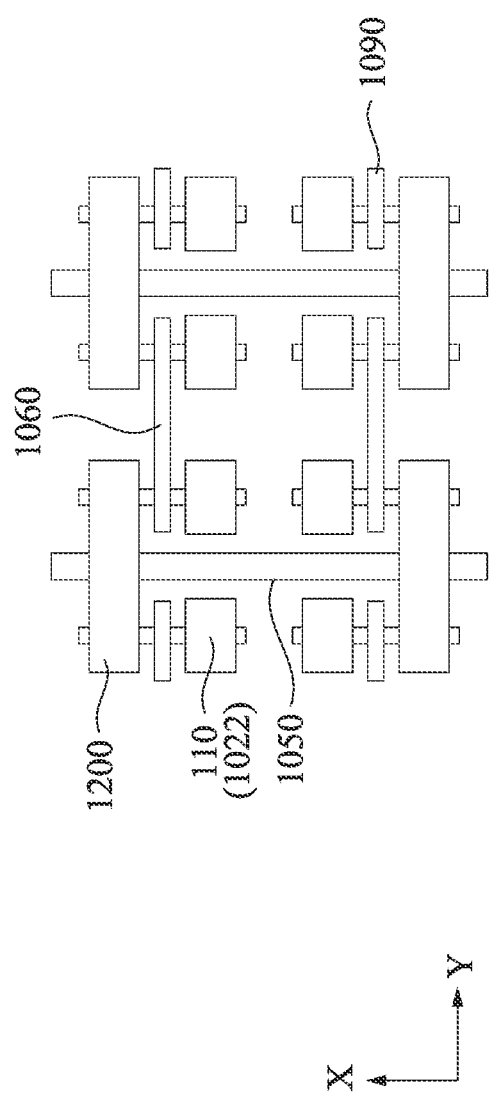

Further, the insulating material layer 1055 is removed, and then as shown in FIGS. 25A and 25B, one or more conductive material layers 1200 as a source/drain electrode are formed in the opening to be in contact with the source/drain region of the semiconductor wire (fin), which is a fin 110 of an NMOS in some embodiments. FIG. 25C is a plan view. The conductive material layer 1200 is also in contact with the buried power supply wiring 1050, and thus, the source of the NMOS is electrically connected to the buried power supply wiring 1050. In some embodiments, the conductive material layer (source/drain electrode) 1200 is one or more layers of Co, Ni, W, Ti, Ta, Cu, Al, TiN and TaN, or any other suitable material. In some embodiments, as shown in FIG. 25D, the conductive layer (source/drain electrode) 1200 is formed over the drain region of the NMOS.

Then, as shown in FIGS. 26A and 26B, an insulating layer 1300 is formed over the source/drain electrodes 1200. The insulating layer 1300 is one or more of silicon oxide, silicon oxynitride, silicon nitride, low-k material or any other suitable insulating material.

Next, as shown in FIG. 27A, the insulating layer 1300 is patterned to form an opening by using one or more lithography operations, and the opening is filled with one or more conductive material layers 1350 to be in contact with the source/drain region of the fin 110 (first semiconductor layer 1022) of the NMOS, and the source/drain region of the fin 210 (first semiconductor layer 1022) of the PMOS.

Further, as shown in FIG. 27B, the insulating layer 1300 is patterned to form an opening by using one or more lithography operations, and the opening is filled with one or more conductive material layers 1400 to be in contact with the source/drain region of the fin 210 (first semiconductor layer 1022) of the PMOS.

When the source/drain contact 1200 is formed on both source and drain regions of the fin 110 of the NMOS as shown in FIG. 25D, the source drain contact 1350 is formed in contact with the source/drain contact 1200 as shown in FIGS. 28A and 28B.

The various embodiments or examples described herein offer several advantages over the existing art. For example, in the present disclosure, since different conductivity-type GAA FETs are vertically stacked, and power supply lines Vdd and Vss are disposed at different levels in the vertical direction, it is possible to reduce the area of the semiconductor device, such as an SRAM.

It will be understood that not all advantages have been necessarily discussed herein, no particular advantage is required for all embodiments or examples, and other embodiments or examples may offer different advantages.

In accordance with one aspect of the present disclosure, a semiconductor device having a standard cell includes a first power supply line, a second power supply line, a first gate-all-around field effect transistor (GAA FET) disposed over a substrate, and a second GAA FET disposed above the first GAA FET. One of the first power supply line and the second power supply line is located below the first GAA FET, and the other of first power supply line and the second power supply line is located above the second GAA FET. In one or more of the foregoing and the following embodiments, the one of the first power supply line and the second power supply line located below the first GAA FET is coupled to the first GAA FET through a bottom via contact. In one or more of the foregoing and the following embodiments, the other of the first power supply line and the second power supply line located above the second GAA FET is coupled to the second GAA FET through a top via contact. In one or more of the foregoing and the following embodiments, the first GAA FET is an n-type FET, and the second GAA FET is a p-type FET, the first power supply line is a VSS, and the second power supply line is VDD, and the first power supply line is located below the first GAA FET and the second power supply line is located above the second GAA FET. In one or more of the foregoing and the following embodiments, the first GAA FET is a p-type FET, and the second GAA FET is an n-type FET, the first power supply line is a VDD and the second power supply line is VSS, and the first power supply line is located below the first GAA FET and the second power supply line is located above the second GAA FET. In one or more of the foregoing and the following embodiments, the first GAA FET and the second GAA FET share a gate, and the standard cell is an inverter circuit.

In accordance with another aspect of the present disclosure, a semiconductor device having a standard cell includes a first power supply line, a second power supply line, a first gate-all-around field effect transistor (GAA FET) disposed over a substrate, and a second GAA FET disposed above the first GAA FET. One of the first power supply line and the second power supply line is located at a same level as the first GAA FET, and the other of first power supply line and the second power supply line is located above the second GAA FET. In one or more of the foregoing and the following embodiments, the other of the first power supply line and the second power supply line located above the second GAA FET is coupled to the second GAA FET through a top via contact. In one or more of the foregoing and the following embodiments, the first GAA FET is an n-type FET, and the second GAA FET is a p-type FET, the first power supply line is a VSS, and the second power supply line is VDD, and the first power supply line is located at the same level as the first GAA FET and the second power supply line is located above the second GAA FET. In one or more of the foregoing and the following embodiments, the first GAA FET includes a source contact in contact with a source of the first GAA FET, and the first power supply line is directly connected to the source contact. In one or more of the foregoing and the following embodiments, the first GAA FET is a p-type FET, and the second GAA FET is an n-type FET, the first power supply line is a VDD and the second power supply line is VSS, and the first power supply line is located at the same level as the first GAA FET and the second power supply line is located above the second GAA FET. In one or more of the foregoing and the following embodiments, the first GAA FET includes a drain contact in contact with a drain of the first GAA FET, and the first power supply line is directly connected to the drain contact. In one or more of the foregoing and the following embodiments, the first GAA FET and the second GAA FET share a gate, and the standard cell is an inverter circuit.

In accordance with another aspect of the present disclosure, a semiconductor device having a standard cell includes a first power supply line, a second power supply line, a first gate-all-around field effect transistor (GAA FET) disposed over a substrate, and a second GAA FET disposed above the first GAA FET. One of the first power supply line and the second power supply line is located at a same level as the first GAA FET, and the other of first power supply line and the second power supply line is located at a same level as the second GAA FET. In one or more of the foregoing and the following embodiments, the first GAA FET is an n-type FET, and the second GAA FET is a p-type FET, the first power supply line is a VSS, and the second power supply line is VDD, and the first power supply line is located at the same level as the first GAA FET and the second power supply line is located at the same level as the second GAA FET. In one or more of the foregoing and the following embodiments, the first GAA FET includes a source contact in contact with a source of the first GAA FET, the second GAA FET includes a drain contact in contact with a drain of the second GAA FET, the first power supply line is directly connected to the source contact, and the second power supply line is directly connected to the drain contact. In one or more of the foregoing and the following embodiments, the first GAA FET is a p-type FET, and the second GAA FET is an n-type FET, the first power supply line is a VDD and the second power supply line is VSS, and the first power supply line is located at the same level as the first GAA FET and the second power supply line is located at the same level as the second GAA FET. In one or more of the foregoing and the following embodiments, the first GAA FET includes a drain contact in contact with a drain of the first GAA FET, the second GAA FET includes a source contact in contact with a source of the first GAA FET, the first power supply line is directly connected to the drain contact, and the second power supply line is directly connected to the source contact. In one or more of the foregoing and the following embodiments, the first GAA FET and the second GAA FET share a gate, and the standard cell is an inverter circuit. In one or more of the foregoing and the following embodiments, a channel of the first GAA FET is made of a same material as a channel of the second GAA FET.

In accordance with another aspect of the present disclosure, a semiconductor device having a standard cell includes a first power supply line, a second power supply line, a first gate-all-around field effect transistor (GAA FET) disposed over a substrate, and a second GAA FET disposed above the first GAA FET. One of the first power supply line and the second power supply line is located below the first GAA FET, and the other of first power supply line and the second power supply line is located at a same level as the second GAA FET. In one or more of the foregoing and the following embodiments, the one of the first power supply line and the second power supply line located below the first GAA FET is coupled to the first GAA FET through a bottom via contact. In one or more of the foregoing and the following embodiments, the first GAA FET is an n-type FET, and the second GAA FET is a p-type FET, the first power supply line is a VSS, and the second power supply line is VDD, and the first power supply line is located below the first GAA FET and the second power supply line is located at the same level as the second GAA FET. In one or more of the foregoing and the following embodiments, the second GAA FET includes a drain contact in contact with a drain of the second GAA FET, and the second power supply line is directly connected to the source contact. In one or more of the foregoing and the following embodiments, the first GAA FET is a p-type FET, and the second GAA FET is an n-type FET, the first power supply line is a VDD and the second power supply line is VSS, and the first power supply line is located below the first GAA FET and the second power supply line is located at the same level as the second GAA FET. In one or more of the foregoing and the following embodiments, the second GAA FET includes a source contact in contact with a source of the second GAA FET, and the second power supply line is directly connected to the source contact. In one or more of the foregoing and the following embodiments, the first GAA FET and the second GAA FET share a gate, and the standard cell is an inverter circuit.

In accordance with another aspect of the present disclosure, a semiconductor device having a standard cell includes a first power supply line, a second power supply line, a first gate-all-around field effect transistor (GAA FET) disposed over a substrate, and a second GAA FET disposed above the first GAA FET. The first power supply line and the second power supply line are located at vertically different levels from each other.

In accordance with another aspect of the present disclosure, in a method of manufacturing a semiconductor device having a standard cell, a buried power line is formed between two fin structures in an isolation insulating layer disposed over a substrate, a vertically stacked complementary MOS FET (CFET) including a first gate-all-around FET (GAA FET) and a second GAA FET stacked over the first GAA FET is formed, an upper power line is formed over the CFET, a source of the first GAA FET is connected to the buried power line, and a source of the second GAA FET is connected to the upper power line.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a standard cell, the standard cell comprising:
    a first gate-all-around field effect transistor (GAA FET) disposed over a substrate;
    a second GAA FET disposed at a vertically different level from the first GAA FET and sharing a gate with the first GAA FET;
    a first power supply line;
    a second power supply line; and
    a first signal line, a second signal line, a third signal line and a fourth signal line, which are disposed above the first GAA FET and the second GAA FET, wherein:
    the first, second, third and fourth signal lines are located at a same level with each other,
    the first power supply line and the second power supply line are located at vertically different levels from each other, and
    a cell height of the standard cell is 4 T, where T is a pitch between the first and second signal lines, the second and third signal lines, and the third and fourth signal lines in plan view.

2. The semiconductor device of claim 1, wherein the first and second power supply lines are located at different levels from the first, second and third signal lines.

3. The semiconductor device of claim 1, wherein the first power supply line is located at a first cell boundary and the second power supply line is located at a second cell boundary, and the cell height is a horizontal distance between the first cell boundary and the second cell boundary.

4. The semiconductor device of claim 1, wherein a width of the one of the first or second power supply lines is greater than a width of the first, second, third and fourth signal lines.

5. The semiconductor device of claim 1, wherein the first and second power supply lines overlap with each other in plan view.

6. The semiconductor device of claim 1, wherein:
    the first GAA FET and the second GAA FET constitute an inverter, one of the first, second, third and fourth signal lines is coupled to the gate as an input of the inverter, and one of the first, second, third and fourth signal lines is coupled to a source or a gate of the first and second GAA FET as an output of the inverter.

7. The semiconductor device of claim 1, wherein the fourth signal line is narrower than the first and second power supply lines.

8. A semiconductor device having a standard cell, the standard cell comprising:

a first gate-all-around field effect transistor (GAA FET) disposed over a substrate;

a second GAA FET disposed at a vertically different level from the first GAA FET and sharing a gate with the first GAA FET;

a first power supply line;

a second power supply line; and a first signal line, a second signal line and a third signal line, which are disposed above the first GAA FET and the second GAA FET, wherein:

the first, second and third signal lines are located at a same level with each other, the first power supply line and the second power supply line are located at vertically different levels from each other, one of the first power supply line or the second power supply line is located at a same level as the first, second and third signal lines, and the one of the first power supply line or the second power supply line, the first signal line, the second signal line and the third signal line are arranged with a constant pitch T, where T is the pitch between the first and second signal lines, and the second and third signal lines in plan view.

9. The semiconductor device of claim 8, wherein the one of the first power supply line or the second power supply line has a same width as the first, second and third signal lines.

10. The semiconductor device of claim 9, wherein a cell height of the standard cell is 3.5 T in plan view.

11. The semiconductor device of claim 9, wherein a center of another of the first power supply line or the second power supply line is located at a same position as one of cell boundaries in plan view.

12. The semiconductor device of claim 9, wherein a center of another of the first power supply line or the second power supply line and a center of the one of the first power supply line or the second power supply line are located at a same position as one of cell boundaries in plan view.

13. The semiconductor device of claim 8, wherein the one of the first power supply line or the second power supply line has a greater width than the first, second and third signal lines.

14. The semiconductor device of claim 8, wherein a cell height of the standard cell is 4 T.

15. The semiconductor device of claim 8, wherein the first GAA FET and the second GAA FET constitute an inverter.

16. The semiconductor device of claim 8, wherein another of the first power supply line or the second power supply line is located at level below the first GAA FET and the second GAA FET.

17. A semiconductor device having a standard cell, the standard cell comprising:

a first gate-all-around field effect transistor (GAA FET) disposed over a substrate;

a second GAA FET disposed at a vertically different level from the first GAA FET;

a first power supply line;

a second power supply line; and a first signal line, a second signal line and a third signal line, which are disposed above the first GAA FET and the second GAA FET, wherein:

the first, second and third signal lines are located at a same level with each other, the first power supply line and the second power supply line are located at vertically different levels from each other, and the first and second power supply lines are located at different levels from the first, second and third signal lines.

18. The semiconductor device of claim 17, wherein a cell height of the standard cell is 3 T, where T is a pitch between the first and second signal lines, the second and third signal lines in plan view.

19. The semiconductor device of claim 17, wherein a cell height of the standard cell is 4 T, where T is a pitch between the first and second signal lines, the second and third signal lines in plan view.

20. The semiconductor device of claim 17, wherein the first and second power supply lines overlap with each other in plan view.

* * * * *